(12) United States Patent
Ishimaru et al.

(10) Patent No.: US 7,341,890 B2
(45) Date of Patent: Mar. 11, 2008

(54) CIRCUIT BOARD WITH BUILT-IN ELECTRONIC COMPONENT AND METHOD FOR MANUFACTURING THE SAME

(75) Inventors: Yukihiro Ishimaru, Hirakata (JP); Tousaku Nishiyama, Nara (JP); Yasuhiro Sugaya, Toyonaka (JP); Toshiyuki Asahi, Osaka (JP)

(73) Assignee: Matsushita Industrial Co., Ltd., Osaka (JP)

( * ) Notice: Subject to any disclaimer, the term of this patent is extended or adjusted under 35 U.S.C. 154(b) by 0 days.

(21) Appl. No.: 11/478,415

(22) Filed: Jun. 28, 2006

(65) Prior Publication Data
US 2006/0244119 A1 Nov. 2, 2006

Related U.S. Application Data

(62) Division of application No. 10/888,140, filed on Jul. 9, 2004, now Pat. No. 7,091,593.

(30) Foreign Application Priority Data
Jul. 9, 2003 (JP) ............................. 2003-272509

(51) Int. Cl.
*H01L 23/02* (2006.01)
*H01L 23/12* (2006.01)

(52) U.S. Cl. ...................... 438/125; 438/123; 438/209; 438/671; 257/686; 257/E21.511; 257/E21.705; 257/E25.011

(58) Field of Classification Search .............. 257/686; 438/123, 125
See application file for complete search history.

(56) References Cited

U.S. PATENT DOCUMENTS

| 6,239,496 B1 | 5/2001 | Asada |
| 6,329,045 B1 | 12/2001 | Hirano et al. |
| 6,784,530 B2 | 8/2004 | Sugaya et al. |

FOREIGN PATENT DOCUMENTS

JP 2001-332866 11/2001

*Primary Examiner*—Dao H. Nguyen
(74) *Attorney, Agent, or Firm*—Hamre, Schumann, Mueller & Larson, P.C.

(57) ABSTRACT

A circuit board with an built-in electronic component according to the present invention includes an insulating layer, a first wiring pattern provided on a first main surface of the insulating layer, a second wiring pattern provided on a second main surface different from the first main surface of the insulating layer, and an electronic component such as a semiconductor chip or the like provided in an internal portion of the insulating layer. The electronic component includes a first external connection terminal formed on a first surface and a second external connection terminal formed on a second surface different from the first surface. The first external connection terminal is connected electrically to the first wiring pattern, and the second external connection terminal is connected electrically to the second wiring pattern.

15 Claims, 25 Drawing Sheets

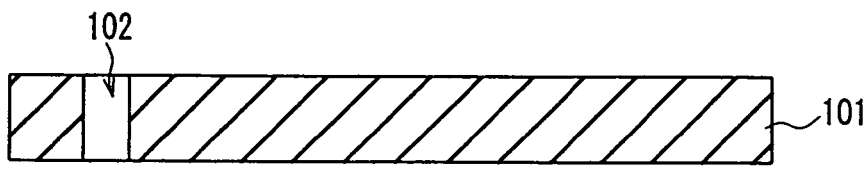
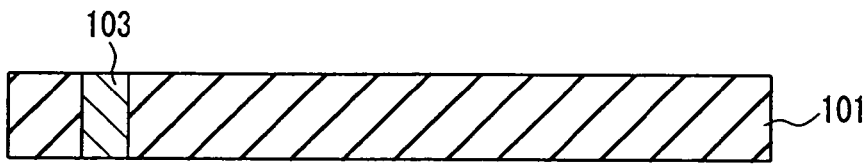
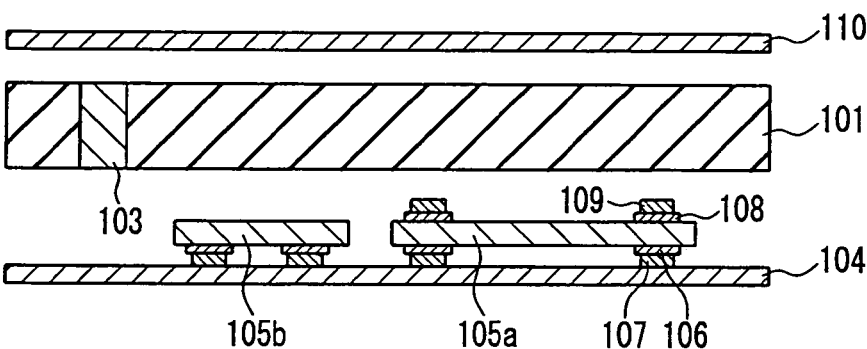
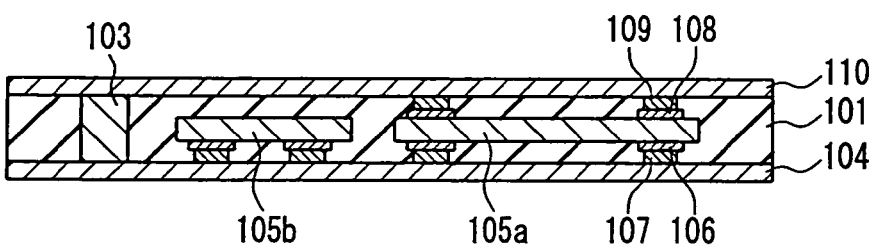
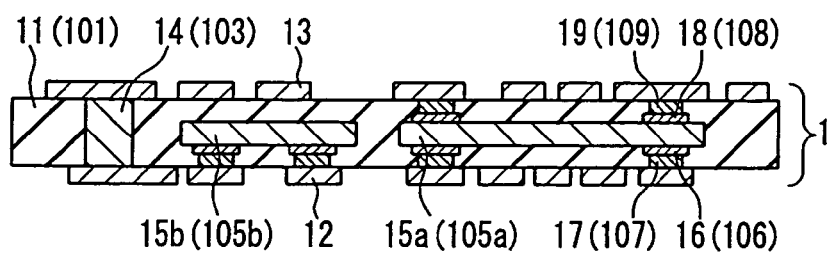

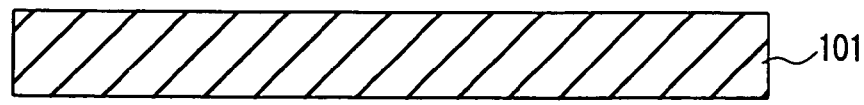
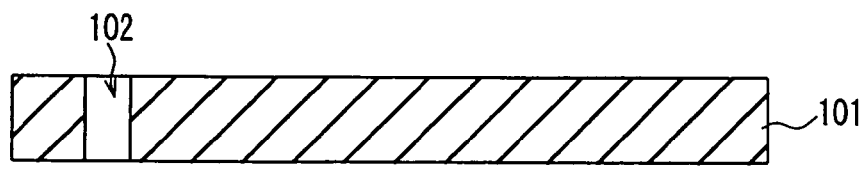
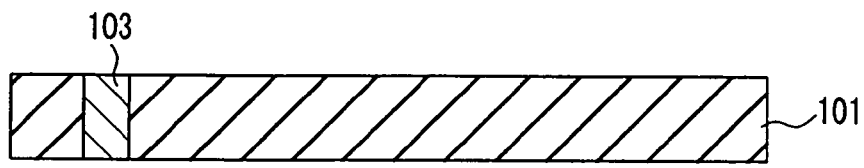
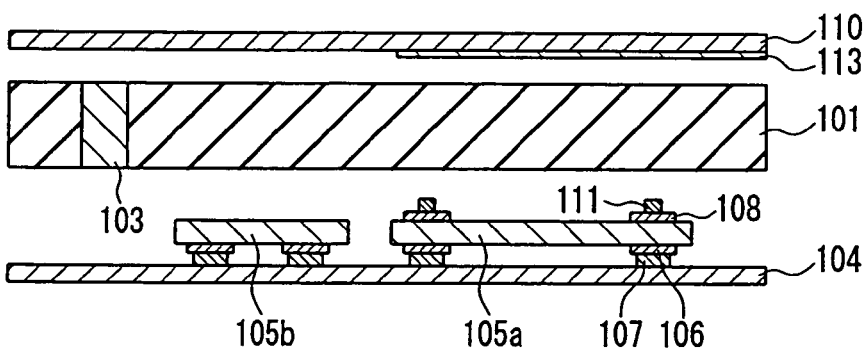
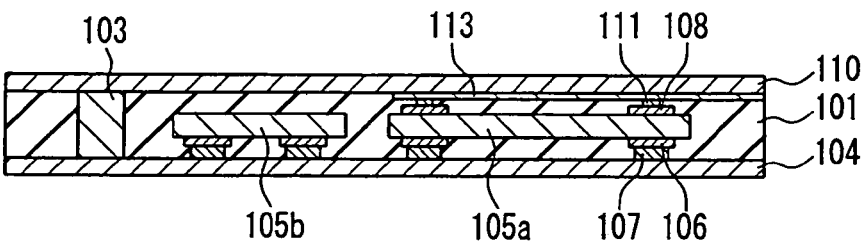
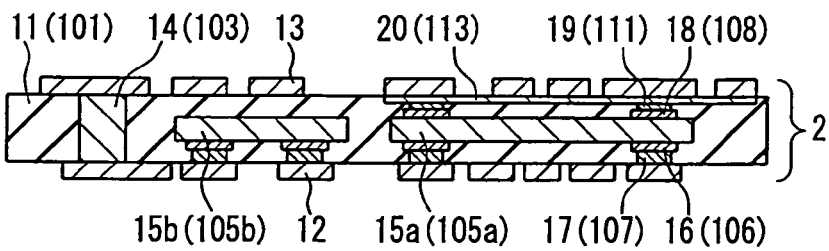

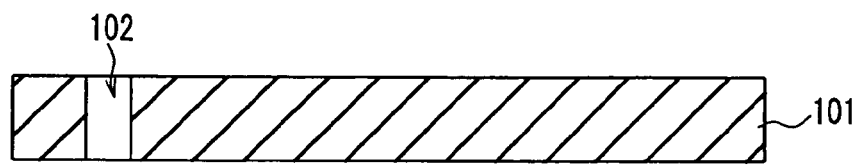
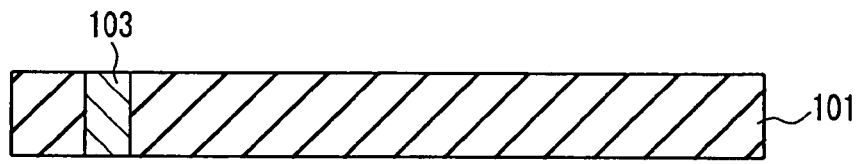
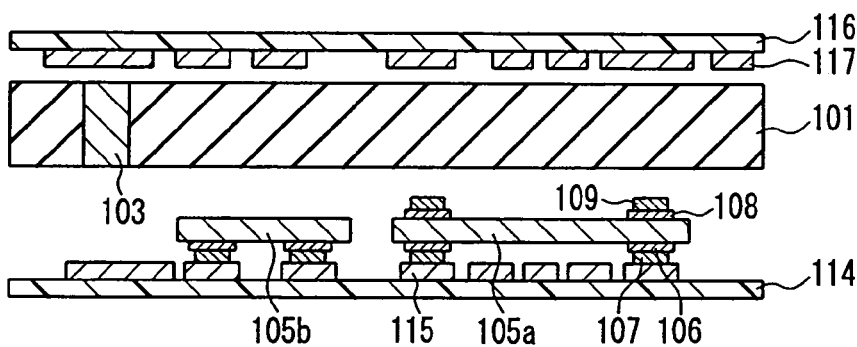
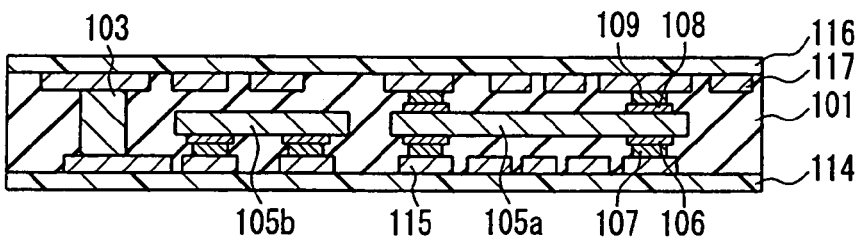
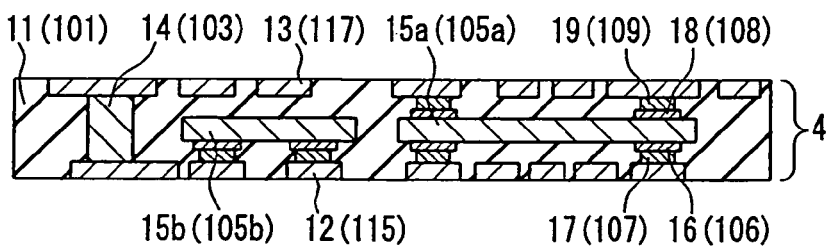

FIG. 10A
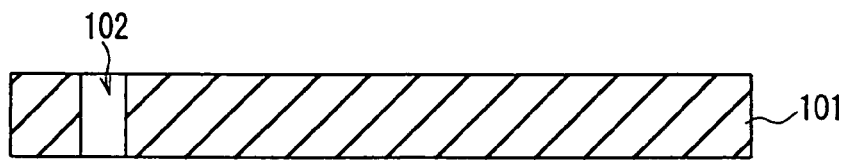
FIG. 10B
FIG. 10C
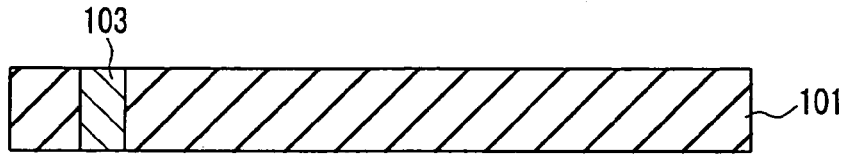
FIG. 10D
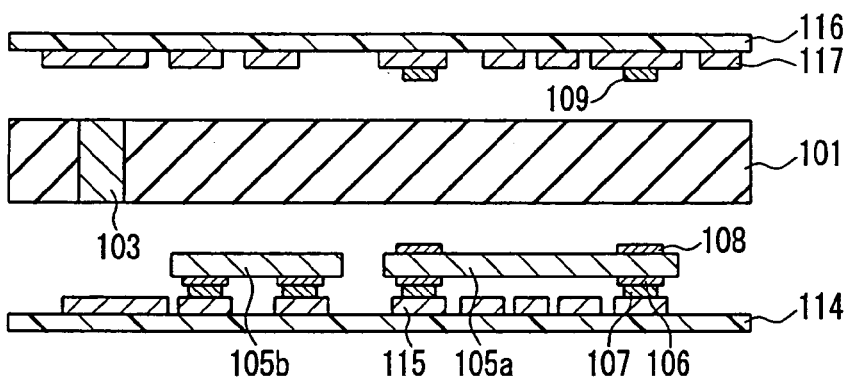
FIG. 10E
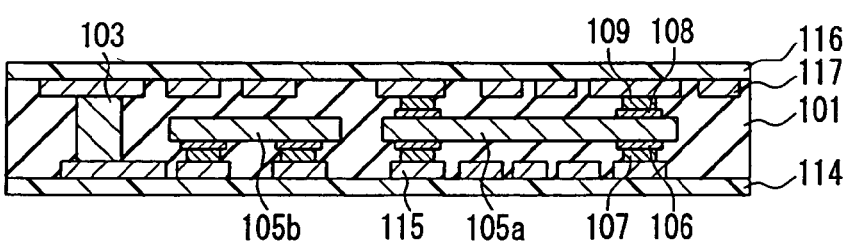
FIG. 10F
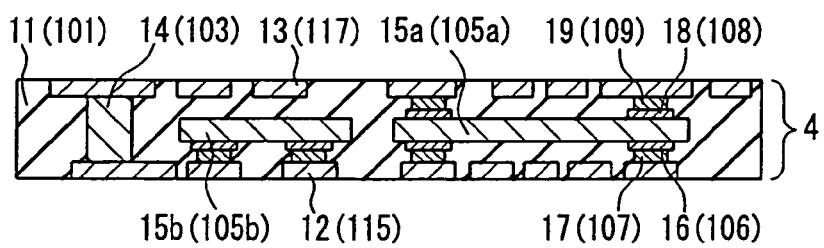

CIRCUIT BOARD WITH BUILT-IN ELECTRONIC COMPONENT AND METHOD FOR MANUFACTURING THE SAME

This application is a division of application Ser. No. 10/888,140, filed Jul. 9, 2004, entitled CIRCUIT BOARD WITH BUILT-IN ELECTRONIC COMPONENT AND METHOD FOR MANUFACTURING THE SAME, U.S. Pat. No. 7,091,593.

BACKGROUND OF THE INVENTION

1. Field of the Invention

The present invention relates to circuit boards with built-in electronic components that have electronic components built in, such as active components such as semiconductor devices or the like and passive components such as capacitors or the like, and methods for manufacturing the same.

2. Related Background Art

Along with a call for higher performance and miniaturization in electronic equipment in recent years, there has been an even greater call for higher density and higher performance in semiconductor devices. Moreover, circuit boards that can achieve miniaturization and high density also are desired. For this reason, circuit boards with built-in electronic components have been proposed (for example, see JP 2001-332866A) that have at least one electronic component such as an active component or a passive component embedded internally and are provided with an inner via through which a wiring pattern and the electronic components are connected electrically.

FIGS. 23 and 24 are cross-sectional views showing configuration examples of conventional circuit boards with built-in electronic components. A circuit board 1001 with built-in electronic components shown in the drawings is an built-in semiconductor device type circuit board. The circuit board 1001 with built-in electronic components shown in FIG. 23 has a multi-layer wiring structure with a first wiring pattern 1002 formed on one main surface (a first main surface) of one side of an insulating layer 1005, and a second wiring pattern 1003 formed on another main surface (a second main surface) of another side of the insulating layer 1005. The insulating layer 1005 is formed with a composite material in which an inorganic filler and a thermosetting resin are mixed. The first wiring pattern 1002 and the second wiring pattern 1003, which are positioned on different surfaces of the insulating layer 1005 from each other, are electrically connected by an inner via 1004 made of an electroconductive resin composition. Semiconductor chips 1006 are embedded inside the insulating layer 1005, and external connection terminals 1007 of the semiconductor chips 1006 are connected electrically to the first wiring pattern 1002 via connection members 1008 (for example, see JP 2001-332866A).

However, there are structural impediments to increasing packaging density in the above-described conventional example and it is difficult to achieve high density. The following is a description of this problem.

In the circuit board 1001 with built-in electronic components shown in FIG. 23, the external connection terminals 1007 of the semiconductor chips 1006 are formed on a surface facing the first wiring pattern 1002, and therefore can be directly connected to the first wiring pattern 1002 using the connection members 1008. In contrast to this, a direct connection is not possible when it is necessary to electrically connect the external connection terminals 1007 to the second wiring pattern 1003, which is opposed to a surface on which the external connection terminals 1007 of the semiconductor chips 1006 are not provided (for example, when connecting an external connection terminal 1007a to a wiring 1003a contained in the second wiring pattern 1003), and therefore a connection must be made via the first wiring pattern 1002 and the inner via 1004. In this manner, because it is necessary to use other wiring (the first wiring pattern 1002) and the inner via 1004 when connecting the external connection terminal 1007 and the second wiring pattern 1003, the containment rate of wiring is reduced, thus making it difficult to achieve higher density.

Furthermore, as shown in FIG. 24, with semiconductor chips 1006 in which external connection terminals are provided on a surface of one side only, the pitch of the external connection terminals is restricted to the pitch of the wiring when connecting external connection terminals 1007b through 1007f to the wirings 1002b through 1002f contained in the wiring pattern 1002. For this reason, regardless of the ability to further miniaturize the semiconductor chips 1006, the size of the semiconductor chips 1006 is restricted due to the above-described reason, so that there is also the problem of miniaturization being inhibited.

SUMMARY OF THE INVENTION

A circuit board with an built-in electronic component of the present invention includes an insulating layer, a first wiring pattern provided on a first main surface of the insulating layer, a second wiring pattern provided on a second main surface different from the first main surface of the insulating layer, and at least one electronic component provided in an internal portion of the insulating layer. The electronic component comprises a first external connection terminal formed on a first surface and a second external connection terminal formed on a second surface different from the first surface. The first external connection terminal is connected electrically to the first wiring pattern, and the second external connection terminal is connected electrically to the second wiring pattern.

A first method for manufacturing a circuit board with an built-in electronic component of the present invention includes (a) positioning and mounting, on a sheet-form first electroconductive body, an electronic component including a first external connection terminal formed on a first surface and a second external connection terminal formed on a second surface different from the first surface so as to form an electronic component-mounted structure in which the first external connection terminal and the first electroconductive body are electrically connected; (b) forming a layered structure by positioning and superposing an uncured sheet-form material formed of a mixture including an inorganic filler and a thermosetting resin, and a sheet-form second electroconductive body in this order on the electronic component-mounted structure; (c) pressing the layered structure in a layered direction and heating the same to embed the electronic component of the electronic component-mounted structure in the sheet-form material, and to connect electrically the second external connection terminal and the second electroconductive body; and (d) forming a wiring patterns using the first electroconductive body and the second electroconductive body respectively.

A second method for manufacturing a circuit board with an built-in electronic component includes (a) positioning and mounting, on a first wiring pattern formed on a support member, an electronic component including a first external connection terminal formed on a first surface and a second external connection terminal formed on a second surface different from the first surface so as to form an electronic component-mounted structure in which the first external connection terminal and the first wiring pattern are electrically connected; (b) forming a layered structure by positioning and superposing an uncured sheet-form material formed of a mixture including an inorganic filler and a thermosetting resin, and a second wiring pattern formed on a support member in this order on the electronic component-mounted structure; and (c) pressing the layered structure in a layered direction and heating the same to embed the electronic component of the electronic component-mounted structure in the sheet-form material, and to connect electrically the second external connection terminal and the second wiring pattern.

It should be noted that in the first and second methods, the uncured sheet-form material also includes a sheet-form material that is cured partially so that the material can be still leaved in a pliable condition.

BRIEF DESCRIPTION OF THE DRAWINGS

FIGS. 2A to 2F are cross-sectional views showing the steps in a first example of a method for manufacturing a circuit board with built-in electronic components of a first embodiment of the present invention.

FIGS. 6A to 6F are cross-sectional views showing the steps in a method for manufacturing a circuit board with built-in electronic components of a second embodiment of the present invention.

FIGS. 9A to 9F are cross-sectional views showing the steps in a first example of a method for manufacturing a circuit board with built-in electronic components of a fourth embodiment of the present invention.

FIGS. 10A to 10F are cross-sectional views showing the steps in a second example of a method for manufacturing a circuit board with built-in electronic components of a fourth embodiment of the present invention.

DETAILED DESCRIPTION OF THE INVENTION

Figure 1:
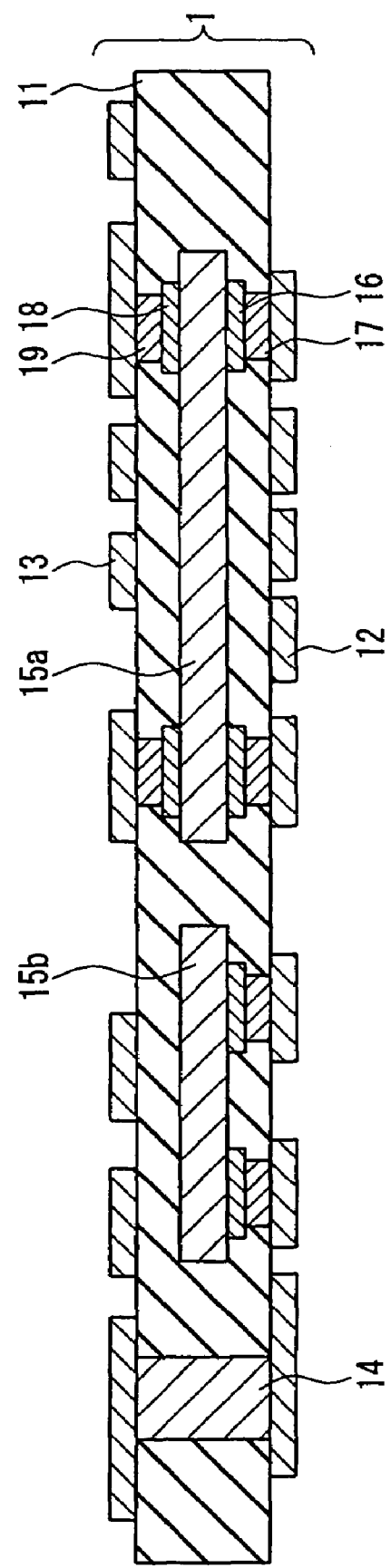
FIG. 1 is a cross-sectional view showing a configuration of a circuit board with built-in electronic components of a first embodiment of the present invention.
Figure 3A:
FIGS. 3A to 3F are cross-sectional views showing the steps in a second example of a method for manufacturing a circuit board with built-in electronic components of a first embodiment of the present invention.
Figure 3B:
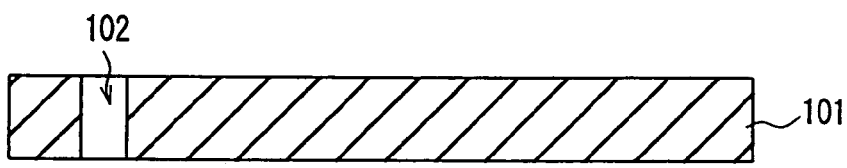
Figure 3C:
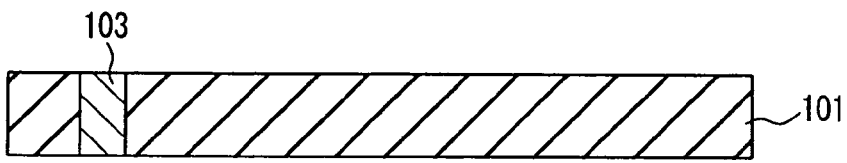
Figure 3D:
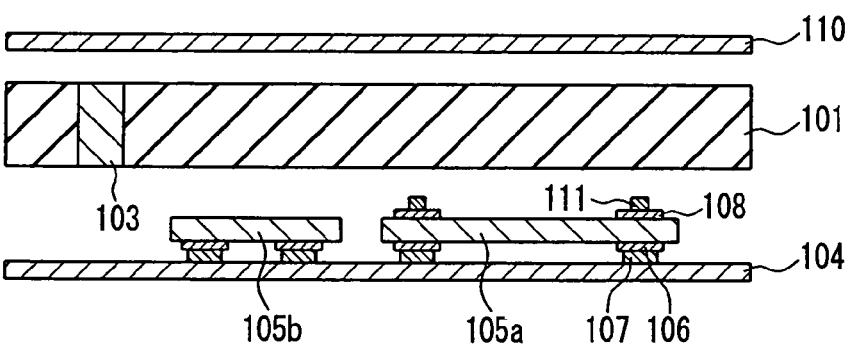
Figure 3E:
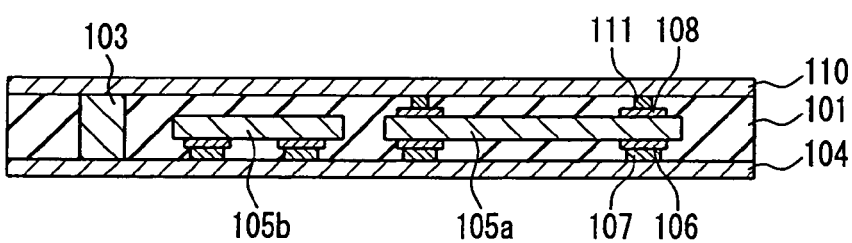
Figure 3F:
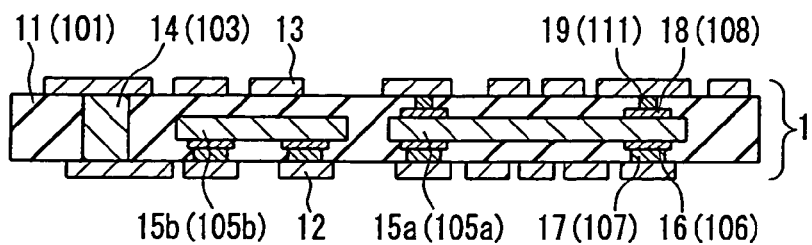
Figure 4A:
FIGS. 4A to 4F are cross-sectional views showing the steps in a third example of a method for manufacturing a circuit board with built-in electronic components of a first embodiment of the present invention.
Figure 4B:
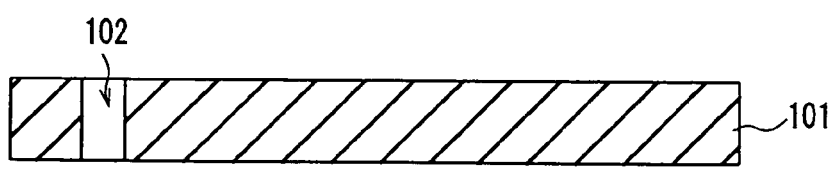
Figure 4C:
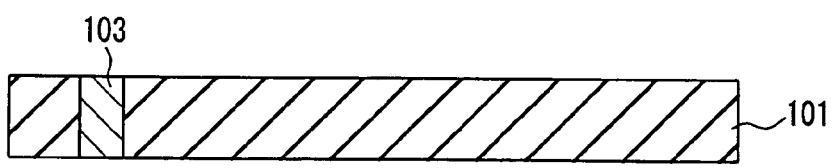
Figure 4D:
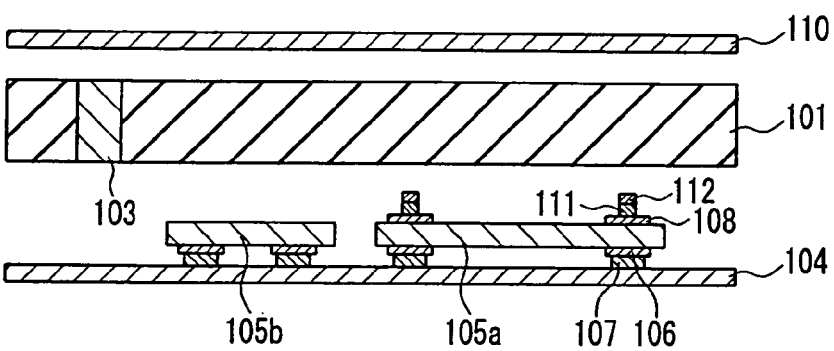
Figure 4E:
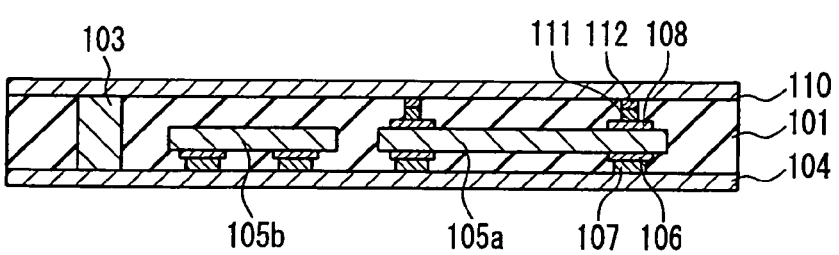
Figure 4F:
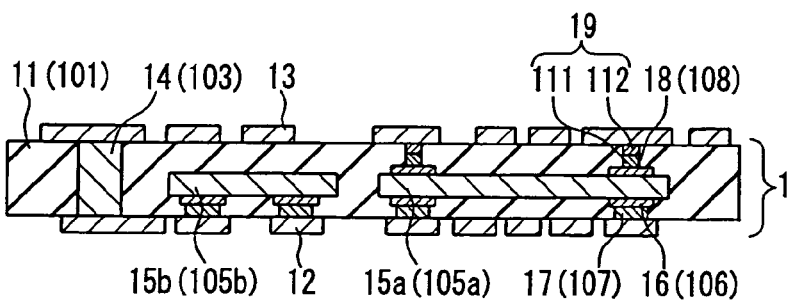

According to a circuit board with built-in electronic components of the present invention, the external connection terminals of the electronic components are provided on different surfaces of the electronic components from each other, and therefore the number of surfaces that can be used in electrically connecting the external connection terminals with the wiring patterns in the built-in electronic components is increased. In this manner, the containment rate of wiring can be increased, and higher density packaging can be achieved. Moreover, this also eases the design rules for the external connection terminals, and can therefore achieve miniaturization. It should be noted that the circuit board with built-in electronic components of the present invention also includes a configuration in which, for example, when the built-in electronic components are formed with a single surface such as that of a spherical body, the external connection terminals are provided so that they face different orientations from each other.

In the circuit board with built-in electronic components of the present invention, it is preferable that the first surface is a surface facing the first wiring pattern in the electronic component and that the second surface is a surface facing the second wiring pattern in the electronic component. This is because the containment rate of wiring can be made very high.

In the circuit board with built-in electronic components of the present invention, it is preferable that the insulating layer in the circuit board is formed of a mixture including an inorganic filler and a thermosetting resin, and it is more preferable that the mixture includes the inorganic filler in an amount of 70 wt % or more and 95 wt % or less. This is because the heat produced by the electronic components can be dissipated speedily by the inorganic filler, and therefore a circuit board with built-in electronic components of high reliability can be obtained. Furthermore, it is preferable that the thermosetting resin contains at least one resin selected from the group consisting of epoxy resins, phenol resins, and isocyanate resins. This is because the cured products resulting from these resins have superior heat resistance and electrical insulation properties. Furthermore, it is preferable that the inorganic filler contains at least one type of substance selected from the group consisting of $Al_{23}$, MgO, BN, AlN, and $SiO_2$. This is because these materials have superior heat dissipation properties. Furthermore, the coefficient of linear expansion of the circuit board with built-in electronic components can be increased when MgO is used as the inorganic filler. Furthermore, the dielectric constant of the circuit board with built-in electronic components can be reduced when $SiO_2$ (in particular, amorphous $SiO_2$) is used as the inorganic filler. Furthermore, the coefficient of linear expansion of the circuit board with built-in electronic components can be lowered when BN is used as the inorganic filler.

In the circuit board with built-in electronic components of the present invention, it is preferable that an inner via through which the first wiring pattern and the second wiring pattern can be mutually electrically connected further is provided. In this manner it is possible to further increase the containment rate of wiring. Furthermore, it is preferable that the inner via is formed of an electroconductive resin composition, as this can be manufactured readily.

In the circuit board with built-in electronic components of the present invention, a semiconductor chip may be used as the electronic component, and it is possible to use a configuration that is formed by laminating at least two semiconductor chips with an adhesive. Furthermore, for the electronic component, it is possible to use a configuration in which at least two semiconductor chips are mounted on a flexible substrate, and the substrate is bent so that orientations that the external connection terminals of the at least two semiconductor chips face are different from each other.

It is preferable that the circuit board with built-in electronic components of the present invention further includes at least one passive component selected from the group consisting of a chip-form resistor, a chip-form capacitor, and a chip-form inductor, and that the passive component is positioned inside the insulating layer. This is because it is possible to achieve a circuit board with built-in electronic components having a desired functionality by including a passive component.

Furthermore, the circuit board with built-in electronic components of the present invention easily can be produced with first and second manufacturing methods of a circuit board with built-in electronic components of the present invention.

In the step (a) of the first and second manufacturing methods of a circuit board with built-in electronic components of the present invention, it is possible to arrange a connection member on the second external connection terminal of the electronic component.

In the step (b) of the first method for manufacturing a circuit board with built-in electronic components of the present invention, it is also possible to form a connection member in a predetermined area on the second electroconductive body, and superpose the second electroconductive body on the sheet-form material with the connection member in a direction facing the sheet-form material.

In the step (b) of the second method for manufacturing a circuit board with built-in electronic components of the present invention, it is also possible to form a connection member in a predetermined area of the second wiring pattern, and superpose the second wiring pattern that is formed on a support member on the sheet-form material with the connection member in a direction facing the sheet-form material. Furthermore, after a step (c) in the second method for manufacturing a circuit board with built-in electronic components of the present invention, it is possible to include a further step in which only the support member is peeled from the layered structure.

In first and second manufacturing methods of a circuit board with built-in electronic components of the present invention, the connection members can be formed from at least one selected from solders, electroconductive resin compositions, anisotropic conductive sheets, and projection electrodes, and furthermore it is possible to form the connection members by layering a projection electrode and an anisotropic conductive sheet or an electroconductive resin composition.

In first and second manufacturing methods of a circuit board with built-in electronic components of the present invention, it is preferable that the mixture contains an inorganic filler in an amount of 70 wt % or more and 95 wt % or less.

Hereinafter, embodiments of the present invention will be described with reference to the accompanying drawings.

First Embodiment

FIG. 1 is a cross-sectional view showing one embodiment of a circuit board with built-in electronic components of the present invention. A circuit board 1 with built-in electronic components of this embodiment includes an insulating layer 11, a first wiring pattern 12 formed on one main surface (a first main surface) of the insulating layer 11, a second wiring pattern 13 formed on another main surface (a second main surface) of the insulating layer 11, an inner via 14 for electrically connecting the first wiring pattern 12 and the second wiring pattern 13, and semiconductor chips (electronic components) 15a and 15b embedded in the insulating layer 11. An external connection terminal (first external connection terminal) 16 is provided on the semiconductor chip 15a on a surface (a first surface) that faces the first wiring pattern 12, and an external connection terminal 18 is provided on a surface (a second surface) that faces the second wiring pattern 13. The external connection terminal 16 is connected electrically to the first wiring pattern 12 via a connection member 17. The external connection terminal (second external connection terminal) 18 is connected electrically to the second wiring pattern 13 via a connection member 19. The semiconductor chip 15b is connected electrically to the first wiring pattern 12.

Any material having electrical insulation properties can be used for the insulating layer 11, but it is preferable that it is formed with a composite material containing an inorganic filler and a thermosetting resin. This is because the heat produced from the semiconductor chips 15a and 15b is dissipated more easily by the inorganic filler contained in the insulating layer 11, and also because factors such as the thermal conductivity and dielectric constant of the insulating layer 11 can be controlled in accordance with the built-in electronic component by selecting the material of the inorganic filler as appropriate. It is preferable that the inorganic filler includes at least one selected from $Al_2O_3$, MgO, BN, AlN, and $SiO_2$. This is because these materials have superior thermal conductivity, and therefore can increase the thermal dissipation properties of the insulating layer 11. It is preferable that the thermosetting resin includes at least one selected from, for example, epoxy resins, phenol resins, and isocyanate resins. This is because the cured products resulting from these thermosetting resins have superior electric insulation, mechanical strength, and heat resistance.

There is no particular limitation regarding the material of the first and second wiring patterns 12 and 13, as long as the material has good electric conductivity and can facilitate circuit patterning, but metal foil is preferable. For example, copper, nickel, aluminum, and alloys including any of these metals as a main component can be used for the metal foil, and copper or an alloy with copper as a main component is preferable in particular. This is because copper has superior electrical conductivity, is inexpensive, and facilitates wiring pattern formations.

It is preferable that the inner via 14 is formed from an electroconductive resin composition in which an electroconductive material and a thermosetting resin are mixed. It is preferable that powered gold, silver, or copper or the like is used as the electroconductive material, but copper in particular is preferable since it has excellent electroconductive properties with little migration, and moreover is inexpensive. Furthermore, it is possible to inhibit increased resistance due to copper oxidation by using a powder in which a silver coating is given to copper particles. It is preferable that the same resin as the thermosetting resin used in forming the insulating layer 11 is used for the thermosetting resin, and liquid epoxy resins are preferable because they are stable in terms of the heat resistance properties.

At least one selected from solders, electroconductive resin compositions, and anisotropic conductive sheets suitably can be used for the connection members 17 and 19. Furthermore, it is also possible to use a projection electrode formed of at least one metal selected from the group consisting of gold, silver, copper, platinum, solder, and aluminum, or an alloy including at least one of these metals. Moreover, a projection electrode coated with an electroconductive resin composition, or a combination of a projection electrode and an anisotropic conductive sheet also can be used suitably. For example, a mixture of gold, silver, copper, or a silver-palladium alloy or the like and a thermosetting resin can be used here for the electroconductive resin compositions.

The semiconductor chip 15a is provided with external connection terminals 16 and 18 that are, for example, aluminum electrodes on two different surfaces. By providing the external connection terminals on two surfaces in this manner, reductions in the containment rate of wiring can be inhibited to achieve high density even when connecting a semiconductor chip 15a respectively to the first wiring pattern 12 and the second wiring pattern 13 formed on different surfaces of the insulating layer 11. Moreover, since both the first wiring pattern 12 and the second wiring pattern 13 can be used, the design rules for the external connection terminals of the semiconductor chip 15a can be eased, and miniaturization of the semiconductor 15a can be achieved.

Next, a first example of a method for manufacturing a circuit board 1 with built-in electronic components of this embodiment will be described with reference to FIGS. 2A to 2F.

First, a sheet-form material 101 is produced by processing a mixture of an inorganic filler and an uncured thermosetting resin into a sheet form (see FIG. 2A). Specifically, a paste-like kneaded material is formed by mixing an inorganic filler and a liquid thermosetting resin, or similarly a paste-like kneaded material is formed by mixing an inorganic filler and thermosetting resin that has been given low viscosity by a solvent, then a sheet-form material 101 is obtained by molding this paste-like kneaded material into a shape with uniform thickness and performing heat treatment. A reason for performing heat treatment is that there is viscosity when a liquid resin is used, so that by proceeding with curing to a certain extent by heat treatment, it is possible to achieve a sheet-form material 101 in which adhesiveness is removed while maintaining the flexibility of an uncured state. Furthermore, when a kneaded material in which a resin has been dissolved by a solvent is used, heat treatment is performed to remove the solvent and similarly remove the adhesiveness while maintaining the flexibility of an uncured state.

Next, a pass-through opening 102 is formed in a predetermined area of the sheet-form material 101, which is in an uncured state (see FIG. 2B). The forming of the pass-through opening 102 can be achieved by processing using a laser-processing method, or a mold, or by a punching process. In particular, with a laser processing method, it is effective to use a carbon dioxide gas laser, an excimer laser, or a YAG laser. This is because these have fast processing speeds.

Next, the inside of the pass-through opening 102 is filled with an electroconductive resin composition 103 (see FIG. 2C). The electroconductive resin composition 103 becomes an inner via 14 (see FIG. 1) via a later thermal curing process. It is also possible to obtain the sheet-form material 101 with the electroconductive resin composition 103 indicated by FIG. 2C, by attaching a mold release film formed of PET (polyethylene terephthalate) or PPS (polyphenylene sulfide) on the sheet-form material 101, forming the pass-through opening 102 and filling the inside of the pass-through opening 102 with the electroconductive resin composition 103.

Next, an electronic component-mounted structure on which semiconductor chips 105a and 105b are mounted on a first electroconductive body 104 of copper foil or the like, and a second electroconductive body 110 of copper foil or the like, which are manufactured in a separate process, are prepared. The electronic component-mounted structure and the second electroconductive body 110 are positioned and superposed on the top and bottom surfaces of sheet-form material 101 shown in FIG. 2C (see FIG. 2D). At this time, a gap may be provided, if necessary, in the sheet-form material 101. On the semiconductor chip 105a, an external connection terminal 108 also is provided on a surface (second surface) on the opposite side of the mounting surface (first surface) on which an external connection terminal 106 connected to the first electroconductive body 104 is provided. Here, a connection member 109 is provided on the external connection terminal 108 that is provided on the surface on the opposite side of the mounting surface, but this may be provided prior to the semiconductor chip 105a being mounted on the first electroconductive body 104, or may be formed after mounting. It is possible to form the connection member 109 using methods including, for example, a plating method in which a solder is formed, a dispensing method or a screen printing method in which an electroconductive resin composition is applied, or a method of attaching an anisotropic conductive sheet. A mixture obtained by kneading gold, silver, copper, or a silver-palladium alloy or the like with a thermosetting resin can be used here as the electroconductive resin composition. Moreover, the connection member 107 used in connecting the external connection terminal 106 and the first electroconductive body 104 may be formed similarly. It should be noted that the semiconductor chip 105b similarly is connected to the first electroconductive body 104. Furthermore, it is preferable that the adhesion surfaces of the first electroconductive body 104 and the second electroconductive body 110 with the sheet-form material 101 are roughened to improve the adhesion to the sheet-form material 101. Furthermore, it is preferable that a coupling process, or a tin, zinc, or nickel plating is implemented on the surfaces of the first electroconductive body 104 and the second electroconductive body 110 similarly to improve adhesion and to prevent oxidation. Furthermore, it is also possible inject a sealing resin between the first electroconductive body 104 and the semiconductor chips 105a and 105b. By doing this, it is possible to adhere the semiconductor chips 105a and 105b to the first electroconductive body 104 firmly.

Next, the layered structure in which the sheet-form material 101, the electronic component-mounted structure, and the second electroconductive body 110 are positioned and superposed is pressed in the layered direction by a pressing device and further heated, so that the semiconductor chips 105a and 105b are embedded in the sheet-form material 101 and the connection member 109 and the second electroconductive body 110 are adhered together so that the whole becomes integrated (see FIG. 2E). At this time, the semiconductor chips 105a and 105b are embedded in the sheet-form material 101 before the thermosetting resin contained in the sheet-form material 101 is cured, and then a heating process is performed, so that the thermosetting resin of the sheet-form material 101 and the thermosetting resin of the electroconductive resin composition 103 are cured. In this manner, the sheet-form material 101, the semiconductor chips 105a and 105b, and the first and second electroconductive bodies 104 and 110 are mutually adhered in a mechanically firm manner. Moreover, the first electroconductive body 104 and the second electroconductive body 110 become electrically connected via the inner via formed by the curing of the electroconductive resin composition 103, and the external connection terminal 108 and the second electroconductive body 110 become electrically connected and fixed via the connection member 109.

Next, the first and second electroconductive bodies 104 and 110 are patterned using an existing photolithography process to form a first wiring pattern 12 and a second wiring pattern 13. In this manner, it is possible to manufacture the circuit board 1 with built-in electronic components of this embodiment (see FIG. 2F). After this, other processes are performed as appropriate, such as mounting other components using soldering and filling insulating resins, but the description of such processes is omitted here.

FIGS. 3A to 3F are cross-sectional views showing the steps in a second example of a method for manufacturing the circuit board 1 with built-in electronic components. Apart from a difference in the structure of the electronic component-mounted structure, the method for manufacturing the second example is the same as the method for manufacturing the first example, and therefore duplicated description is omitted here.

The steps (see FIGS. 3A to 3C) in which the sheet-form material 101 filled with the electroconductive resin composition 103 is manufactured are the same as in the first example.

Following this, an electronic component-mounted structure on which the semiconductor chips 105a and 105b are mounted on the first electroconductive body 104 and the second electroconductive body 110, which are manufactured separately, are prepared. The electronic component-mounted structure and the second electroconductive body 110 are positioned and superposed on the top and bottom surfaces of the sheet-form material 101 shown in FIG. 3C (see FIG. 3D). At this time, a gap may be provided, if necessary, in the sheet-form material 101. Unlike in the first example, the electronic component-mounted structure used here has a projection electrode 111 formed on the external connection terminal 108 that is provided on the surface on the opposite side of the mounting surface of the semiconductor chip 105a. The projection electrode 111 becomes connection member 19 (see FIG. 1) via a later process. It should be noted that the structure of the electronic component-mounted structure here is otherwise the same as in the first example. The projection electrode 111 can be formed using wiring such as gold and aluminum or the like in equipment such as a bump bonder, and can also be formed by applying and curing an electroconductive resin composition.

Subsequent steps (see FIGS. 3E and 3F) are the same as in the first example.

In the case of the second example, the reliability of the electrical connection can be increased by using the projection electrode 111 in the connection of the external connection terminal 108 of the semiconductor chip 105a to the second electroconductive body 110.

FIGS. 4A to 4F are cross-sectional views showing the steps in a third example of a method for manufacturing the circuit board 1 with built-in electronic components. Apart from a difference in the structure of the electronic component-mounted structure, the method for manufacturing the third example is the same as the method for manufacturing the first example described with reference to FIGS. 2A to 2F, and therefore duplicated description is omitted here.

The steps (see FIGS. 4A to.4C) in which the sheet-form material 101 filled with the electroconductive resin composition 103 is manufactured are the same as in the first example.

Following this, an electronic component-mounted structure on which the semiconductor chips 105a and 105b are mounted on the first electroconductive body 104 and the second electroconductive body 110, which are manufactured separately, are prepared. The electronic component-mounted structure and the second electroconductive body 110 are positioned and superposed on the top and bottom surfaces of the sheet-form material 101 shown in FIG. 4C (see FIG. 4D). At this time, a gap may be provided, if necessary, in the sheet-form material 101. Unlike in the first and second examples, the electronic component-mounted structure used here has a projection electrode 111 formed on the external connection terminal 108 that is provided on the surface on the opposite side of the mounting surface of the semiconductor chip 105a as well as a further electroconductive resin composition 112 applied to the projection electrode 111. It should be noted that the structure of the electronic component-mounted structure here is otherwise the same as in the first example. The projection electrode 111 can be formed with a same method as described in regard to the second example. A mixture obtaining by kneading gold, silver, copper, platinum, solder, or a silver-palladium alloy or the like with a thermosetting resin can be used here as the electroconductive resin composition 112, which can be formed using a method such as applying an electroconductive resin composition onto the projection electrode 111 using a dispensing method or a method in which an electroconductive resin composition is scrapped with the projection electrode 111.

Subsequent steps (see FIGS. 4E and 4F) are the same as in the first example.

In the case of the third example, the reliability of the electrical connection can be increased further by using the layered structure of the projection electrode 111 and the electroconductive resin composition 112 as the connection member 19.

Second Embodiment

Figure 5:
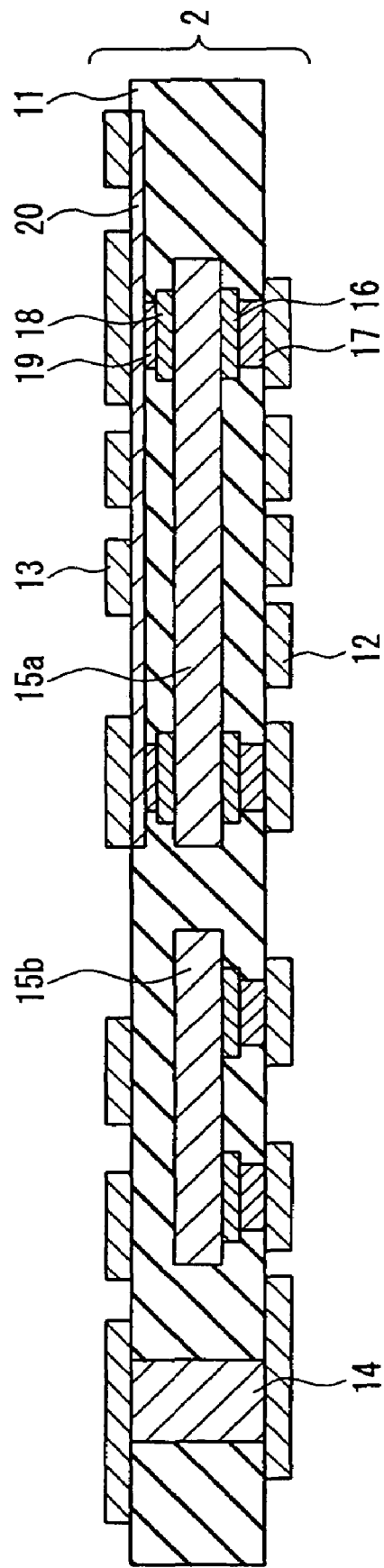
FIG. 5 is a cross-sectional view showing a configuration of a circuit board with built-in electronic components of a second embodiment of the present invention.

FIG. 5 is a cross section of another embodiment of a circuit board with built-in electronic components of the present invention. Apart from the structure of the electrical connection portion of the semiconductor chip 15a and the second wiring pattern 13, a circuit board 2 with built-in electronic components of this embodiment is the same as the circuit board 1 with built-in electronic components described in the first embodiment, and therefore description of components with the same reference numbers is omitted here.

In the circuit board 2 with built-in electronic components of this embodiment, the external connection terminal 18 of the semiconductor chip 105a is connected to the second wiring pattern 13 via a connection member 19 and an anisotropic conductive sheet 20. The anisotropic conductive sheet 20 is positioned between a predetermined area of the second wiring pattern 13 and the insulating layer 11. In this manner, the reliability of the connection of the external connection terminal 18 and the second wiring pattern 13 can be made even higher.

Next, an example method for manufacturing the circuit board 2 with built-in electronic components is described with reference to FIGS. 6A to 6F. Apart from differences in the second electroconductive body 110, the method for manufacturing the circuit board 2 with built-in electronic components of this embodiment is the same as the method described in the first embodiment (the method described with reference to FIGS. 3A to 3F), and therefore duplicated description is omitted here.

The steps (see FIGS. 6A to 6C) in which the sheet-form material 101 filled with the electroconductive resin composition 103 is manufactured are the same as in the first embodiment.

Following this, an electronic component-mounted structure on which the semiconductor chips 105a and 105b are mounted on the first electroconductive body 104 and the second electroconductive body 110, which are manufactured separately, are prepared. The electronic component-mounted structure and the second electroconductive body 110 are positioned and superposed on the top and bottom surfaces of the sheet-form material 101 shown in FIG. 6C (see FIG. 6D). At this time, a gap may be provided, if necessary, in the sheet-form material 101. The electronic component-mounted structure used here has the projection electrode 111 formed on the external connection terminal 108 that is provided on a surface of an opposite side to the mounting surface of the semiconductor chip 105a. The method of forming the projection electrode 111 is the same as described for the first embodiment. On the other hand, an anisotropic conductive sheet 113 is attached to the second electroconductive body 110 in an area facing the semiconductor chip 105a.

Subsequent steps (see FIGS. 6E and 6F) are the same as in the first embodiment.

With the above-described manufacturing method, a circuit board 2 with built-in electronic components that has higher connection reliability can be manufactured by attaching the anisotropic conductive sheet 113 to the second electroconductive body 110 in advance.

Third Embodiment

Figure 7:
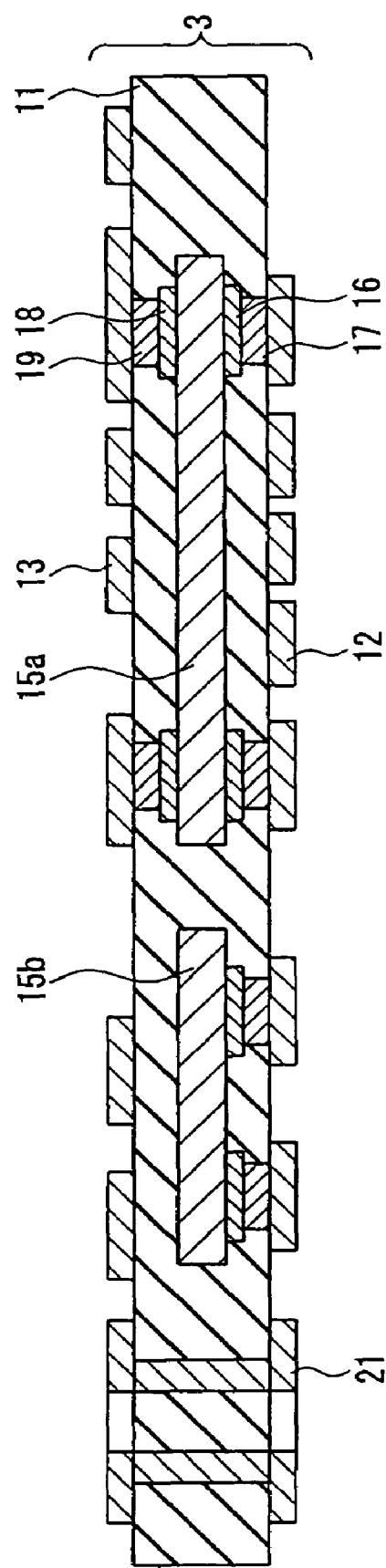
FIG. 7 is a cross-sectional view showing a configuration of a circuit board with built-in electronic components of a third embodiment of the present invention.

FIG. 7 is a cross section of another embodiment of a circuit board with built-in electronic components of the present invention. Apart from being provided with a through-hole 21 rather than an inner via to electrically connect the first wiring pattern 12 and the second wiring pattern 13, a circuit board 3 with built-in electronic components of this embodiment is the same as the circuit board 1 with built-in electronic components described in the first embodiment. After the semiconductor chip 15a is embedded in the insulating layer 11 and integrated as a whole, the through-hole 21 is formed by performing a hole-machining such as drilling or laser processing, then further performing a plating process.

With the circuit board 3 with built-in electronic components, it is also possible to obtain the same effect as the circuit boards 1 and 2 with built-in electronic components.

Fourth Embodiment

Figure 8:
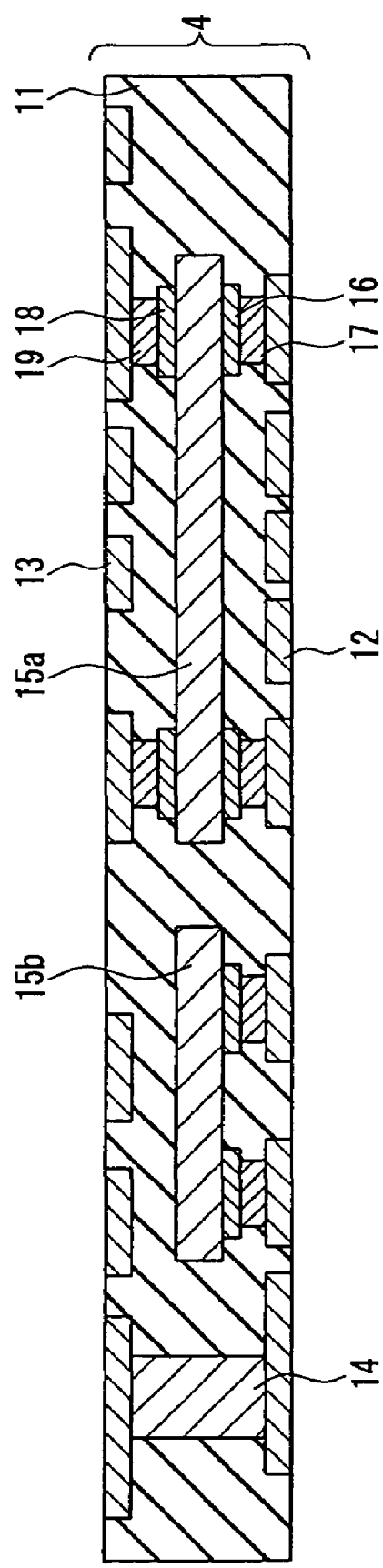
FIG. 8 is a cross-sectional view showing a configuration of a circuit board with built-in electronic components of a fourth embodiment of the present invention.

FIG. 8 is a cross section of another embodiment of a circuit board with built-in electronic components of the present invention. Apart from the first wiring pattern 12 and the second wiring pattern 13 being embedded and positioned in the insulating layer 11, a circuit board 4 with built-in electronic components of this embodiment is the same as the circuit board 1 with built-in electronic components described in the first embodiment. With the circuit board 4 with built-in electronic components, in addition to the effect obtainable with the circuit board 1 with built-in electronic components of the first embodiment, it is also possible to obtain an effect such that the surface of the board is made smooth so that the subsequent mounting properties are superior.

Next, a first example of a method for manufacturing the circuit board 4 with built-in electronic components is described with reference to FIGS. 9A to 9F.

The steps (see FIGS. 9A to 9C) in which the sheet-form material 101 filled with the electroconductive resin composition 103 is manufactured are the same as in the first embodiment.

Following this, an electronic component-mounted structure on which the semiconductor chips 105a and 105b are mounted on a first wiring pattern 115 formed on a mold release film (support member) 114, and a second wiring pattern 117 formed on a mold release film (support member) 116, which are manufactured separately, are prepared. The electronic component-mounted structure and the mold release film 116 on which the second wiring pattern 117 is formed are positioned and superposed on the top and bottom surfaces of the sheet-form material 101 shown in FIG. 9C. (see FIG. 9D). At this time, a gap may be provided, if necessary, in the sheet-form material 101. In the electronic component-mounted structure used here, the first wiring pattern 115 can be formed by forming a electroconductive body film of copper foil or the like on the mold release film 114, and patterning this electroconductive body film in a predetermined shape using an ordinary photolithography process. The electronic component-mounted structure is formed by mounting the semiconductor chips 105a and 105b on the first wiring pattern 115. Furthermore, the connection member 109 is provided on the external connection terminal 108 that is provided on the surface on the opposite side of the mounting surface of the semiconductor chip 105a. Furthermore, the second wiring pattern 117 that is formed on the mold release film 116 also can be formed by the same method as the first wiring pattern 115. Film made of polyethylene terephthalate, for example, can be used for the mold release films 114 and 116. It is also possible to use metal peelable clad foils instead of the mold release films 114 and 116.

Next, the layered structure in which the following are positioned and superposed: the sheet-form material 101; the electronic component-mounted structure (in which the first wiring pattern 115 is formed on the mold release film 114 and the semiconductor chips 105a and 105b are mounted thereon); and the mold release film 116 on which the second wiring pattern 117 is formed; is pressed in the layered direction by a pressing device and further heated. With this step, the semiconductor chips 105a and 105b are embedded in the sheet-form material 101 and the connection member 109 formed on the external connection terminal 108 of the semiconductor chip 105a and the second wiring pattern 117 are brought into contact so that the whole becomes integrated (see FIG. 9E). This step is substantially the same as in the first embodiment.

Next, only the mold release films 114 and 116 are peeled from the integrated layered structure. In this manner, the circuit board 4 with built-in electronic components can be manufactured (see FIG. 9F).

FIGS. 10A to 10F are cross-sectional views showing the steps in a second example of a method for manufacturing the circuit board 4 with built-in electronic components.

The steps (see FIGS. 10A to 10C) in which the sheet-form material 101 filled with the electroconductive resin composition 103 is manufactured are the same as in the first embodiment.

Following this, an electronic component-mounted structure on which the semiconductor chips 105a and 105b are mounted on the first wiring pattern 115 formed on the mold release film 114, and the second wiring pattern 117 formed on the mold release film 116, which are manufactured separately, are prepared. The electronic component-mounted structure and the mold release film 116 on which the second wiring pattern 117 is formed are positioned and superposed on the top and bottom surfaces of the sheet-form material 101 shown in FIG. 10C (see FIG. 10D). At this time, a gap may be provided, if necessary, in the sheet-form material 101. The electronic component-mounted structure used here is not provided with a connection member on the external connection terminal 108 of the mounted semiconductor chip 105a, but the rest of its structure is the same as in the first example. On the other hand, a connection member 109 is provided in a predetermined position (a position corresponding to the external connection terminal 108 of the mounted semiconductor chip 105a) on the second wiring pattern 117 formed on the mold release film 116. Exemplary methods of forming the connection member 109 include a method such as applying an electroconductive resin composition using a dispensing method or a screen printing method, or a method of attaching an anisotropic conductive sheet that has been processed into a desired shape.

Next, the layered structure in which the following are positioned and superposed: the sheet-form material 101; the electronic component-mounted structure (in which the first wiring pattern 115 is formed on the mold release film 114, and the semiconductor chips 105a and 105b are mounted thereon); and the mold release film 116 on which the second wiring pattern 117 and the connection member 109 are formed; is pressed in the layered direction by a pressing device and further heated so that the semiconductor chips 105a and 105b are embedded in the sheet-form material 101 and the external connection terminal 108 of the semiconductor chip 105a and the connection member 109 are brought into contact to form an integrated whole (see FIG. 10E). This step is substantially the same as in the first embodiment.

Fifth Embodiment

Figure 11:
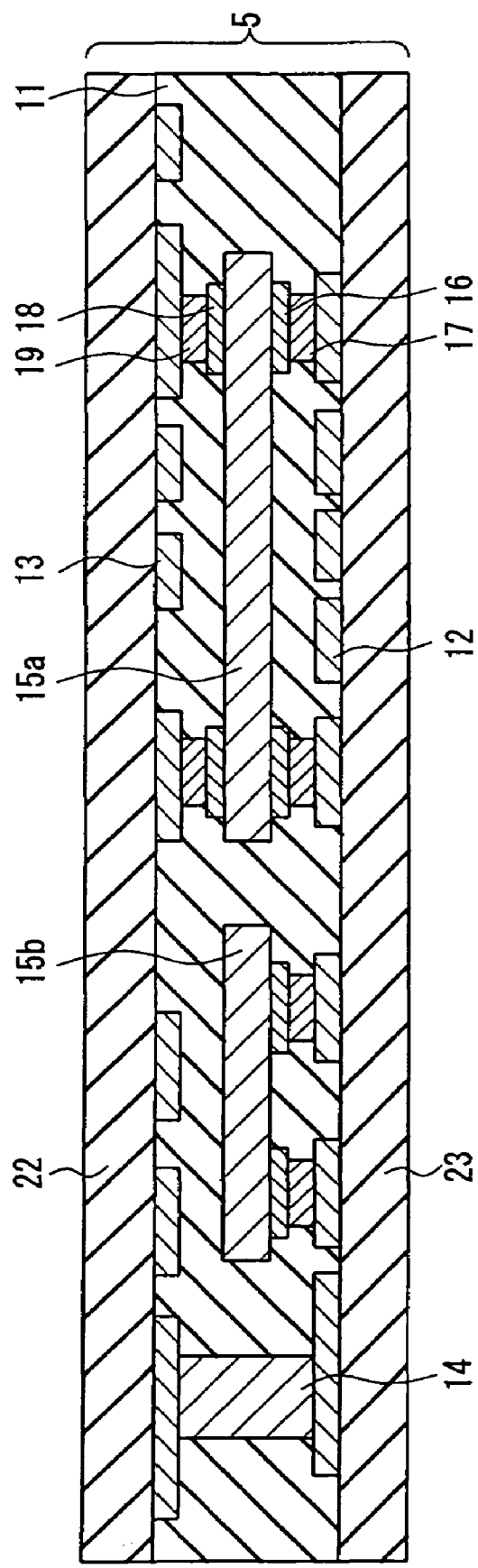
FIG. 11 is a cross-sectional view showing a configuration of a circuit board with built-in electronic components of a fifth embodiment of the present invention.
Figure 12A:
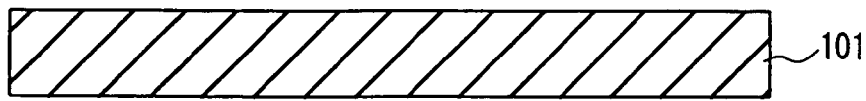
FIGS. 12A to 12E are cross-sectional views showing the steps in a method for manufacturing a circuit board with built-in electronic components of a fifth embodiment of the present invention.
Figure 12B:
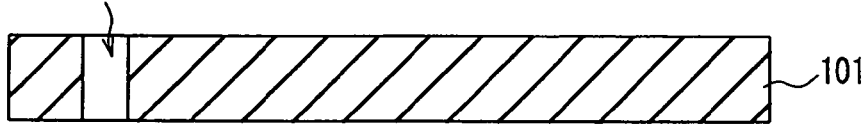
Figure 12C:
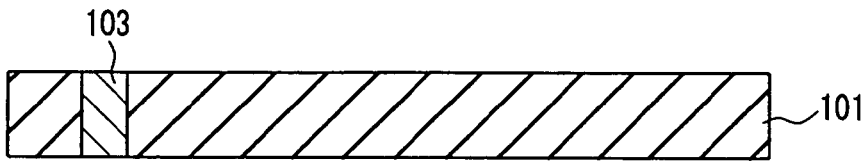
Figure 12D:
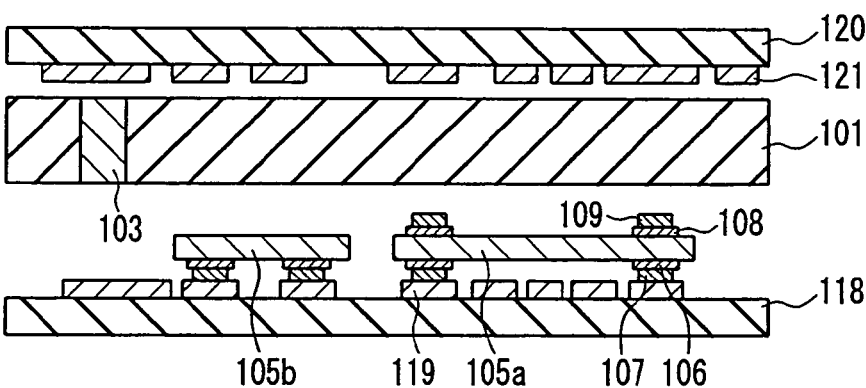
Figure 12E:
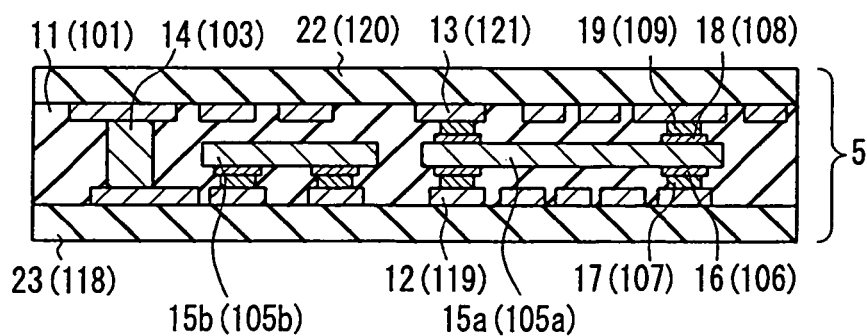
Figure 21:
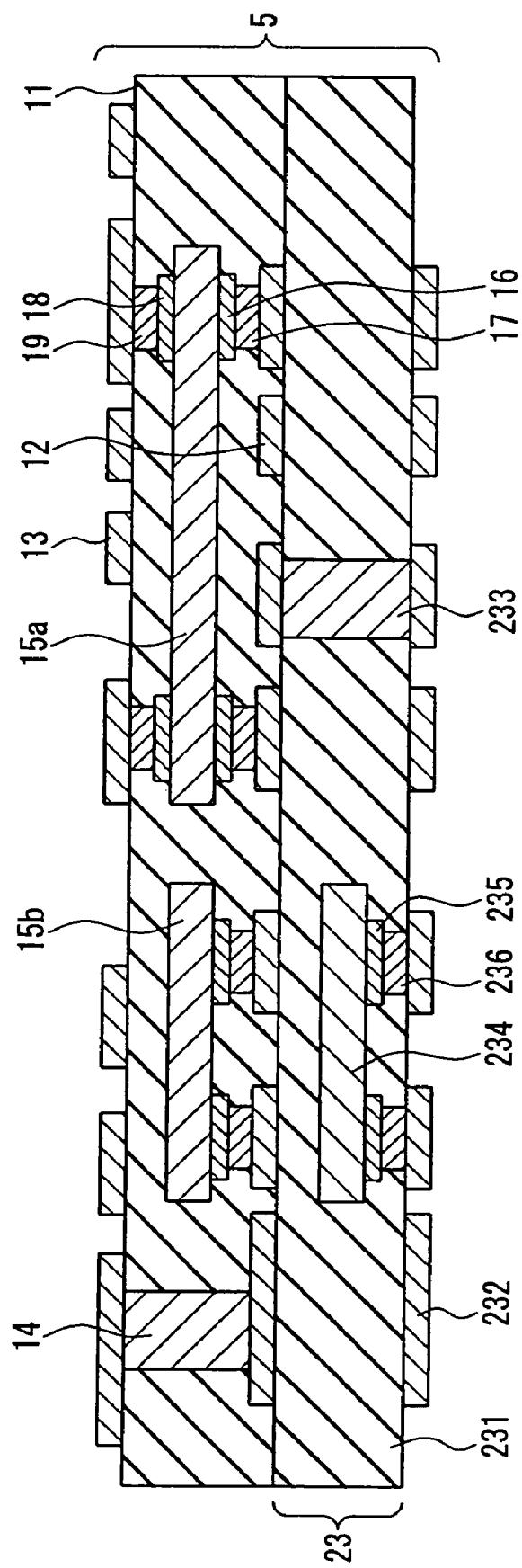
FIG. 21 is a cross-sectional view showing a configuration example of a circuit board with built-in electronic components of a fifth embodiment of the present invention.

FIG. 11 is a cross section of another embodiment of a circuit board with built-in electronic components of the present invention. A circuit board 5 with built-in electronic components of this embodiment is formed with other circuit boards 22 and 23 layered on the top and bottom surfaces of the circuit board 1 with built-in electronic components shown in FIG. 1. With the circuit board 5 with built-in electronic components, the containment rate of wiring can be increased even more than the circuit board 1 with built-in electronic components and packaging density can be increased since the circuit boards 22 and 23 are further provided. Flexible substrates, resin substrates, ceramic substrates, double-faced circuit boards, multi-layer circuit boards, and circuit boards with built-in electronic components can be used suitably for the circuit boards 22 and 23. It should be noted that the circuit boards 22 and 23 are provided on both surfaces of the insulating layer 11 in the circuit board 5 with built-in electronic components of this embodiment, but also can be provided on only one surface. As one example of the circuit board 5 with built-in electronic components, a configuration is conceivable in which the circuit board 23 is provided on only one surface of the insulating layer 11, similar to as shown in FIG. 21. In this example, the circuit board 23 is formed with a semiconductor chip 234 built in an insulating layer 231, and an external connection terminal 235 of the semiconductor chip 234 is electrically connected to a wiring pattern 232 of the circuit board 23 via a connection member 236. Furthermore, the wiring pattern 232 of the circuit board 23 is connected electrically to the first wiring pattern 12 via an inner via 233.

FIGS. 12A to 12E are cross-sectional views showing the steps in an example method for manufacturing the circuit board 5 with built-in electronic components shown in FIG. 11.

The steps (see FIGS. 12A to 12C) in which the sheet-form material 101 filled with the electroconductive resin composition 103 is manufactured are the same as in the first embodiment.

Following this, an electronic component-mounted structure on which the semiconductor chips 105a and 105b are mounted on the first wiring pattern 119 formed on the circuit board 118, and the second wiring pattern 121 formed on the circuit board 120, which are manufactured separately, are prepared. It should be noted-that the circuit boards 118 and 120 function as support members in this embodiment. The electronic component-mounted structure and the circuit board 120 on which the second wiring pattern 121 is formed are positioned and superposed on the top and bottom surfaces of the sheet-form material 101 shown in FIG. 12C (see FIG. 12D). At this time, a gap may be provided, if necessary, in the sheet-form material 101. A connection member 109 is provided on the external connection terminal 108 provided on the surface on the opposite side of the mounting surface of the semiconductor chip 105a. A sealing resin may be injected between the circuit board 118 and the semiconductor chip 105a in the electronic component-mounted structure. By doing this, it is possible to adhere the first wiring pattern 119 and the semiconductor chip 105a firmly.

Next, the layered structure in which the following are positioned and superposed: the sheet-form material 101; the electronic component-mounted structure (in which the first wiring pattern 119 is formed on the circuit board 118, and the semiconductor chips 105a and 105b are mounted thereon); and the mold release film 120 on which is formed the second wiring pattern 121; is pressed in the layered direction by a pressing device and further heated so that the semiconductor chips 105a and 105b, as well as the first wiring pattern 119 and the second wiring pattern 121, are embedded in the sheet-form material 101 and the connection member 109 formed on the external connection terminal 108 of the semiconductor chip 105a and the second wiring pattern 121 are brought into contact to form an integrated whole. This step is substantially the same as in the first embodiment. At this time, the circuit boards 118 and 120 are adhered to the insulating layer 101 in a mechanically firm manner. Through this process, the circuit board 5 with built-in electronic components is completed (see FIG. 12E).

Sixth Embodiment

Figure 13:
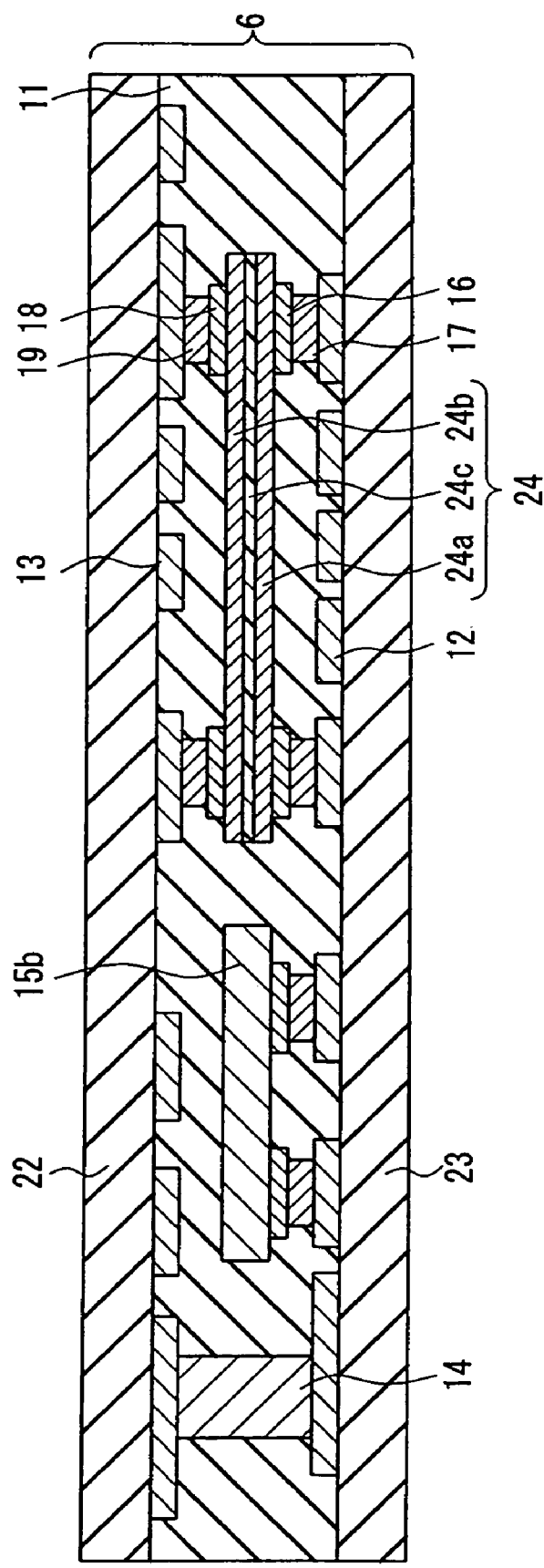
FIG. 13 is a cross-sectional view showing a first configuration example of a circuit board with built-in electronic components of a sixth embodiment of the present invention.
Figure 14A:
FIGS. 14A to 14E are cross-sectional views showing the steps in a method for manufacturing a circuit board with built-in electronic components of a sixth embodiment of the present invention.
Figure 14B:
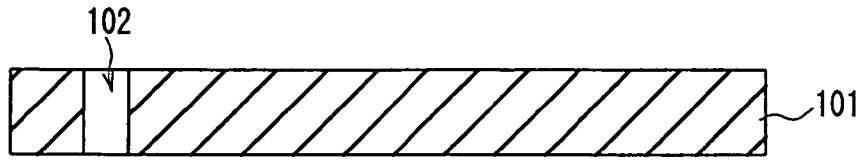
Figure 14C:
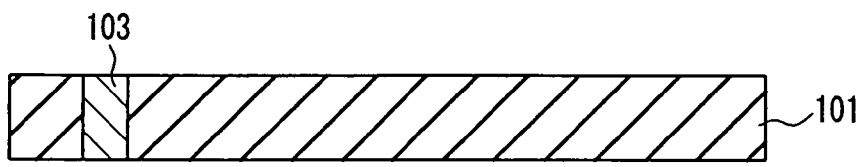
Figure 14D:
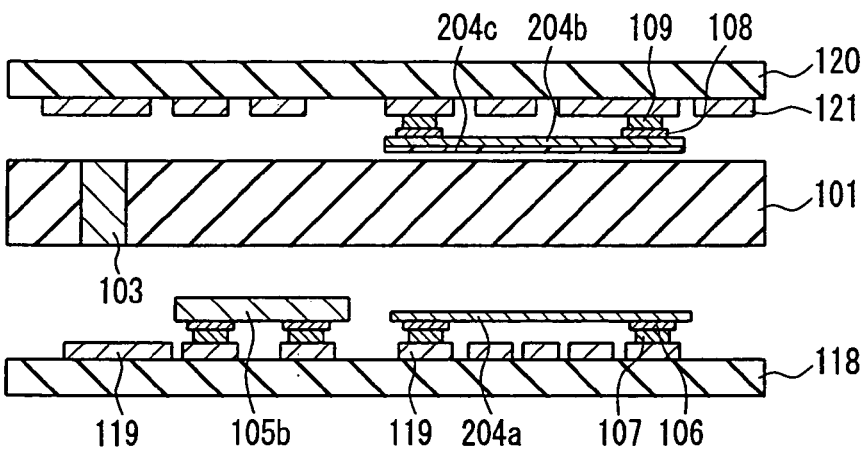
Figure 14E:
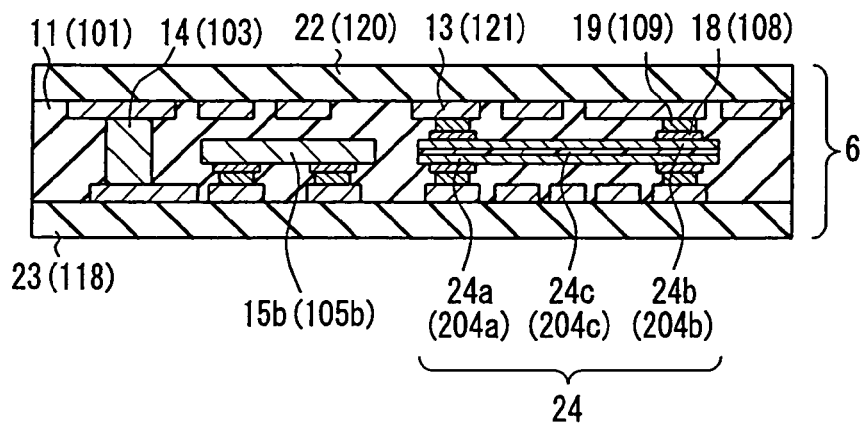

FIG. 13 is a cross section of another embodiment of a circuit board with built-in electronic components of the present invention. Apart from a different structure of the built-in semiconductor chips, a circuit board 6 with built-in electronic components of this embodiment is the same as the circuit board 5 with built-in electronic components of the fifth embodiment. In the built-in semiconductor chips 24 in this embodiment, two semiconductor chips 24a and 24b are attached to each other with an adhesive 24c such that their surfaces on which there are no external connection terminals are opposed to each other. The same effect as the circuit board 5 with built-in electronic components of the fifth embodiment can be obtained with the circuit board 6 with built-in electronic components.

FIGS. 14A to 14E are cross-sectional views showing the steps in an example method for manufacturing the circuit board 6 with built-in electronic components shown in FIG. 13.

The steps (see FIGS. 14A to 14C) in which the sheet-form material 101 filled with the electroconductive resin composition 103 is manufactured are the same as in the first embodiment.

Following this, an electronic component-mounted structure on which semiconductor chips 204a and 105b are mounted on the first wiring pattern 119 formed on the circuit board 118, and an electronic component-mounted structure on which a semiconductor chip 204b is mounted on the second wiring pattern 121 formed on the circuit board 120, which are manufactured separately, are prepared. An external connection terminal 106 of the semiconductor chip 204a is connected to the first wiring pattern 119 via a connection member 107. An external connection terminal 108 of the semiconductor chip 204b is connected to the second wiring pattern 121 via a connection member 109. An adhesive 204c is applied to the surface of the semiconductor chip 204b. In the electronic component-mounted structure, a sealing resin may be injected between the circuit board 118 and the semiconductor chip 204a, and between the circuit board 120 and the semiconductor chip 204b. By doing this, it is possible to adhere firmly the first wiring pattern 119 and the semiconductor chip 204a, and the second wiring pattern 121 and the semiconductor chip 204b respectively. The electronic component-mounted structure on which the semiconductor chips 204a and 105b are mounted, and the electronic component-mounted structure on which the semiconductor chip 204b is mounted are positioned and superposed on the top and bottom surfaces of the sheet-form material 101 shown in FIG. 14C (see FIG. 14D). At this time, a gap may be provided, if necessary, in the sheet-form material 101. In this case, the electronic component-mounted structures can be positioned such that the semiconductor chip 204a and the semiconductor chip 204b are opposed to each other.

Next, the layered structure in which the sheet-form material 101 and the two electronic component-mounted structures (the structure in which the semiconductor chips 204a and 105b are mounted on the circuit board 118, and the structure in which the semiconductor chip 204b is mounted on the circuit board 120) are positioned and superposed is pressed in the layered direction by a pressing device and further heated. In this manner, the semiconductor chips 204a and 105b, the first wiring pattern 119, the semiconductor chip 204b, and the second wiring pattern 121 are embedded in the sheet-form material 101 to form an integrated whole. At this time, the semiconductor chip 204a and the semiconductor chip 204b are attached with the adhesive 204c. The circuit boards 118 and 120 are adhered to the insulating layer 101 in a mechanically firm manner. Through this process, the circuit board 6 with built-in electronic components is completed (see FIG. 14E).

It should be noted that, in the example manufacturing method shown in FIGS. 14A to 14E, the semiconductor chips 204a and 204b are attached to each other after the semiconductor chips 204a and 204b have been mounted respectively on the circuit boards 118 and 120, but it is also of course possible to apply a manufacturing method described in the embodiments 1 to 5 by using a configuration in which the semiconductor chips 204a and 204b are attached to each other in advance.

Figure 15:
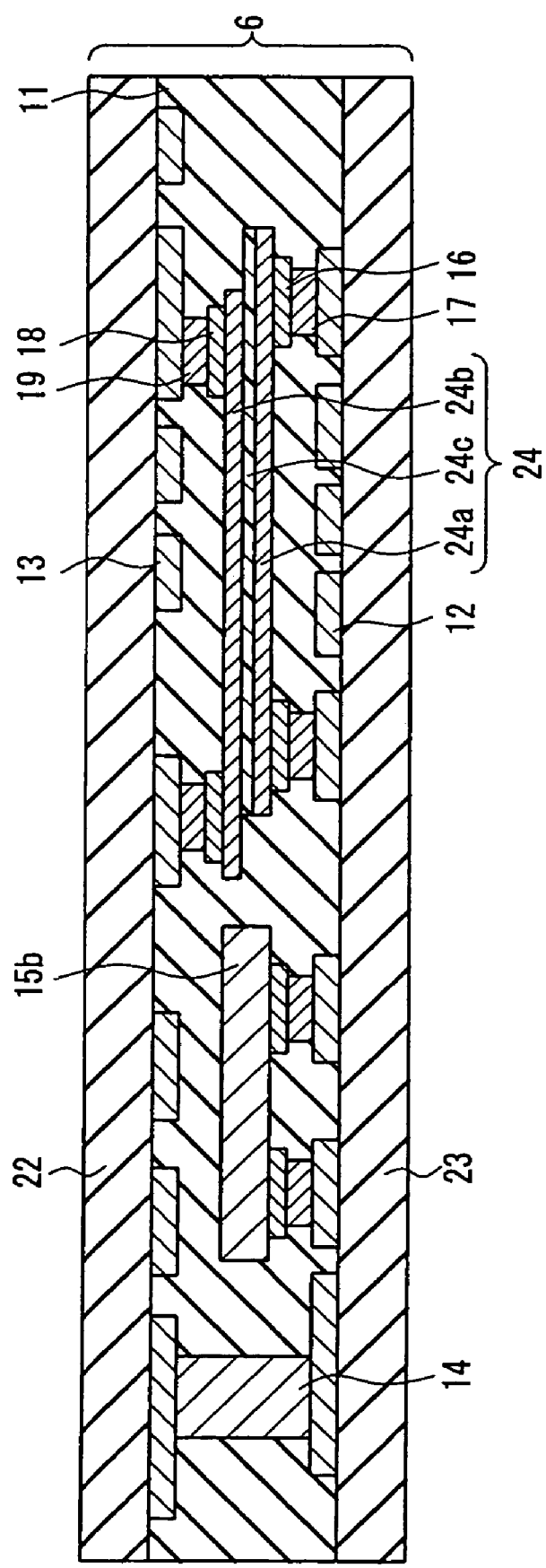
FIG. 15 is a cross-sectional view showing a second configuration example of a circuit board with built-in electronic components of a sixth embodiment of the present invention.
Figure 16:
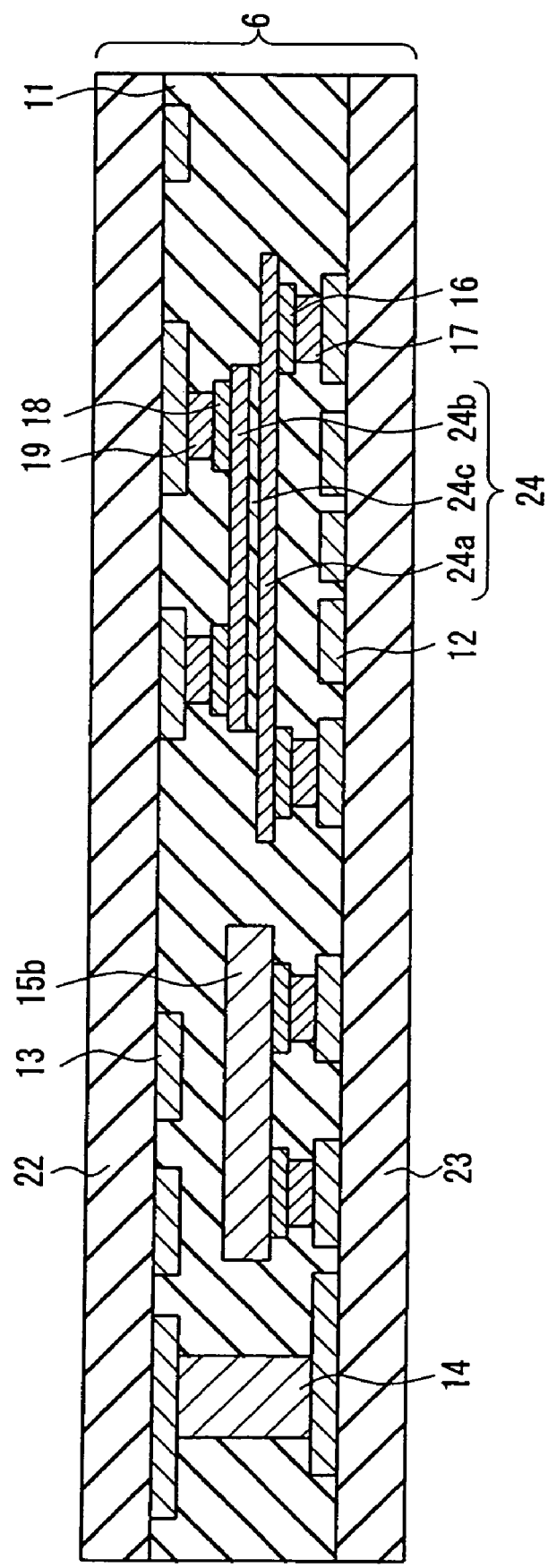
FIG. 16 is a cross-sectional view showing a third configuration example of a circuit board with built-in electronic components of a sixth embodiment of the present invention.

Furthermore, in the configuration example shown in FIG. 13, the two same-size semiconductor -chips 24a and 24b are attached without any displacement, but it is also possible to attach the two semiconductor chips 24a and 24b with a displacement as in the configuration example shown in FIG. 15. Moreover, rather than semiconductor chips of the same size, it is possible to attach two semiconductor chips 24a and 24b of different sizes as in the configuration example shown in FIG. 16. Furthermore, the semiconductor chips to be attached also may have different thicknesses.

Figure 17:
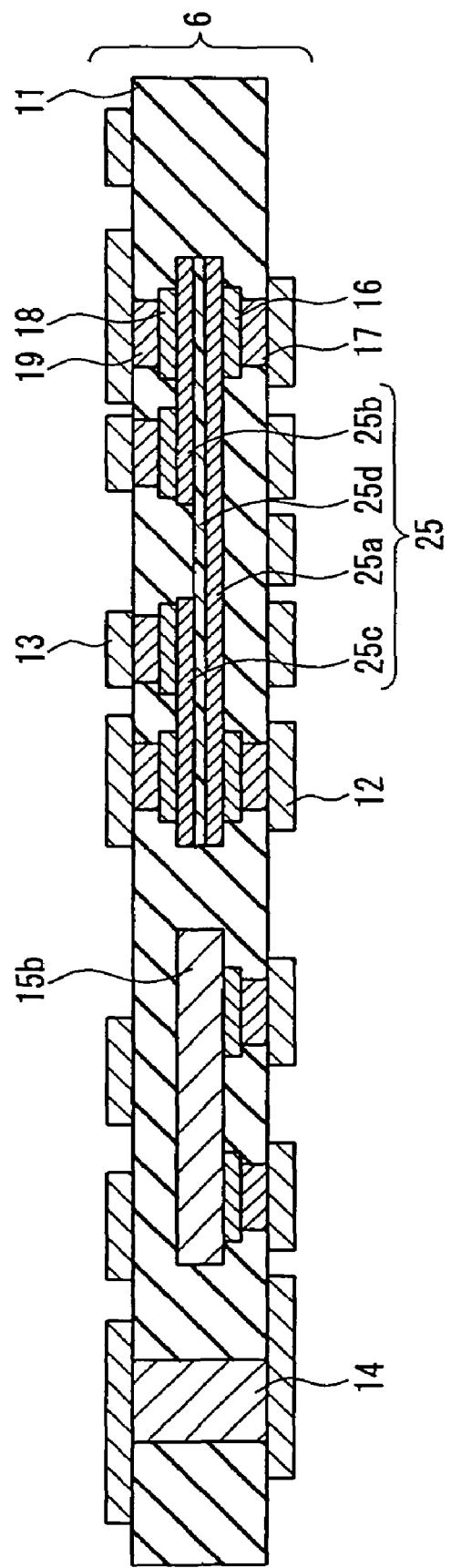
FIG. 17 is a cross-sectional view showing a fourth configuration example of a circuit board with built-in electronic components of a sixth embodiment of the present invention.

Further still, the number of semiconductor chips to be attached to each other is not limited to two, but may be three or more. For example, as shown in FIG. 17, a semiconductor chip 25 is possible in which three semiconductor chips 25a to 25c are attached together with an adhesive 25d.

Figure 18:
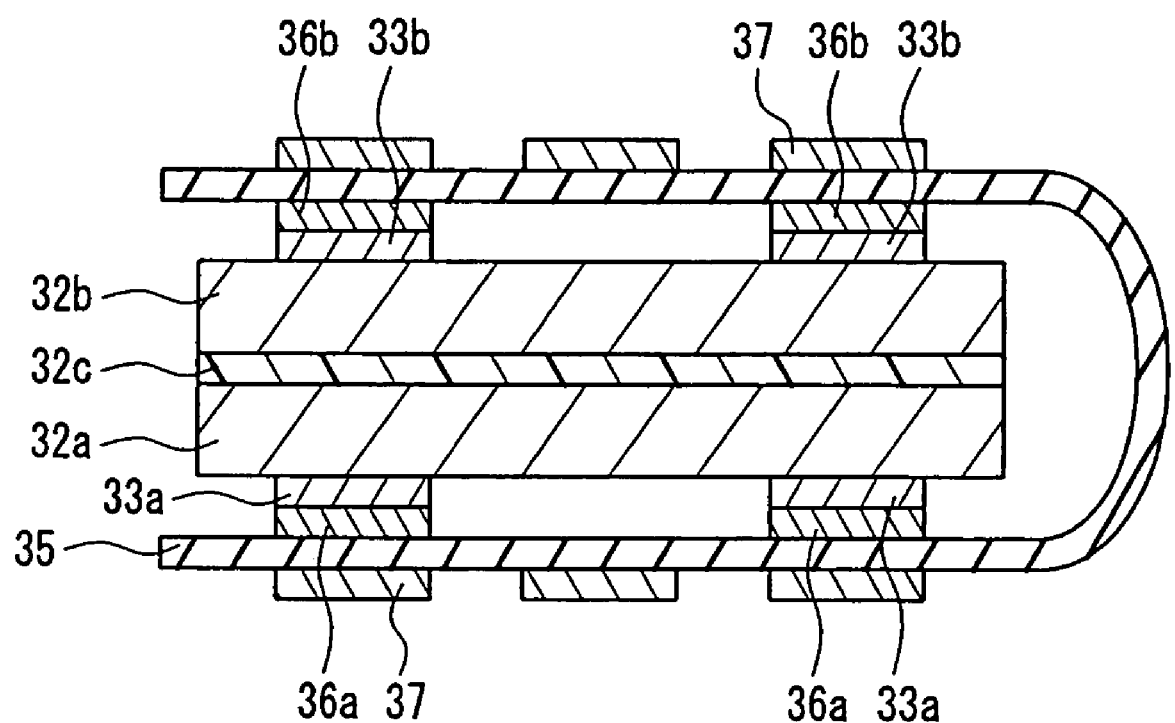
FIG. 18 is a cross-sectional view showing a configuration example of an electronic component formed by a plurality of semiconductor chips.

Furthermore, the structure of the electronic components formed by attaching a plurality of semiconductor chips is not limited by the above description and, for example, it is possible to use a configuration such as that shown in FIG. 18 in which external connection terminals 33a and 33b of a plurality of semiconductor chips 32a and 32b are respectively joined to a flexible substrate 35 such as a resin film by connection members 36a and 36b, and the substrate 35 is bent such that the external connection terminals 33a and 33b of the semiconductor chips 32a and 32b face opposite directions. It should be noted that an electroconductive material such as a solder for example can be used for the connection members 36a and 36b. A wiring pattern 37 is provided on the surface on the opposite side of the surface on which the connection members 36a and 36b are provided on the substrate 35 and, although not particularly evident in the drawings, the connection members 36a and 36b and the wiring pattern 37 are electrically connected inside the substrate 35. It should be noted that an example is shown in FIG. 18 in which the substrate 35 is bent such that the external connection terminals 33a and 33b of the semiconductor chips 32a and 32b face opposite sides, but there is no limitation to this and it is also possible to use a configuration in which the substrate 35 is bent such that the external connection terminals 33a and 33b face different orientations from each other.

Seventh Embodiment

Figure 19A:
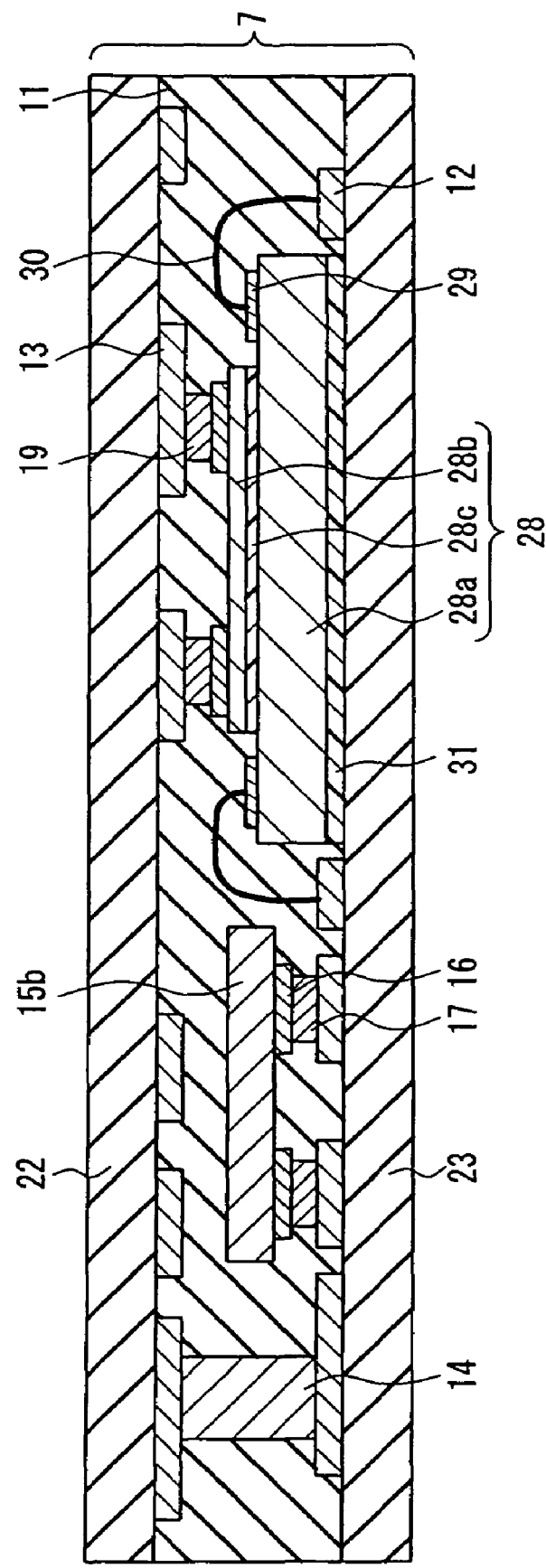
FIGS. 19A and 19B are cross-sectional views showing a configuration of a circuit board with built-in electronic components of a seventh embodiment of the present invention.
Figure 19B:
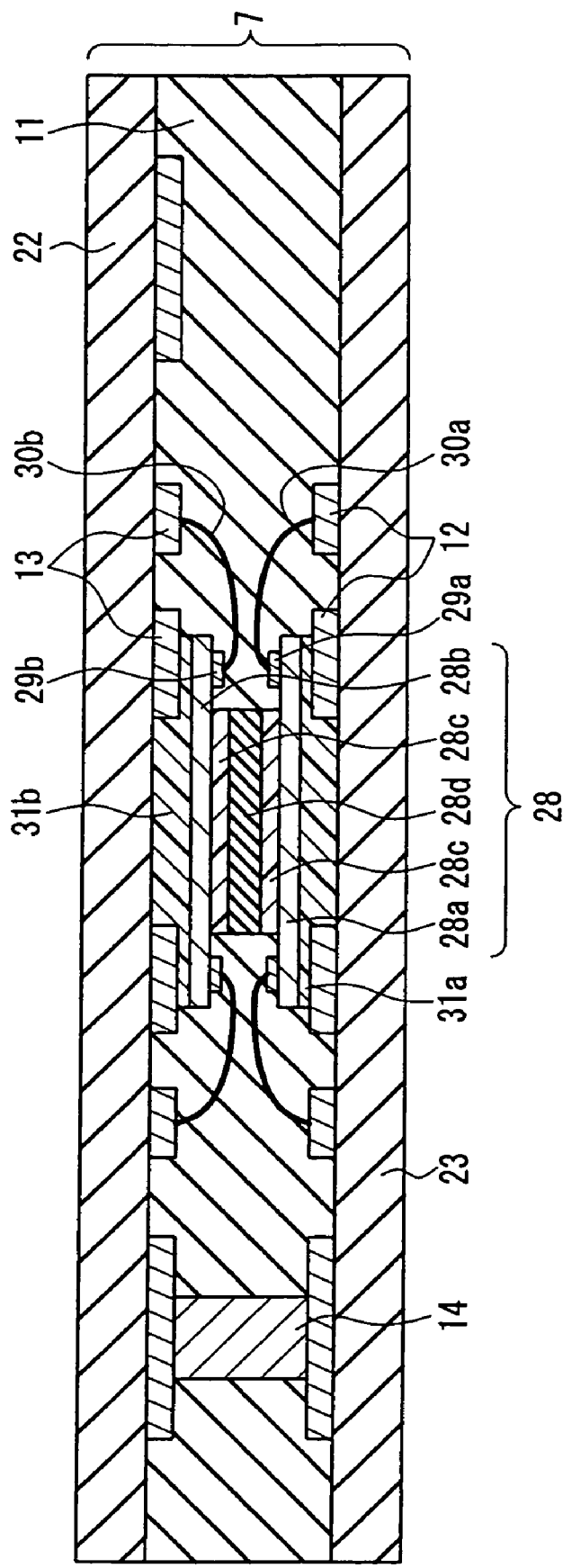
Figure 20A:
FIGS. 20A to 20E are cross-sectional views showing the steps in a method for manufacturing a circuit board with built-in electronic components of a seventh embodiment of the present invention.
Figure 20B:
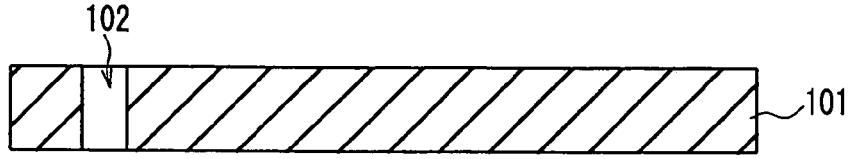
Figure 20C:
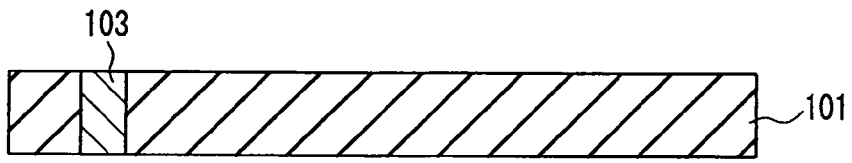
Figure 20D:
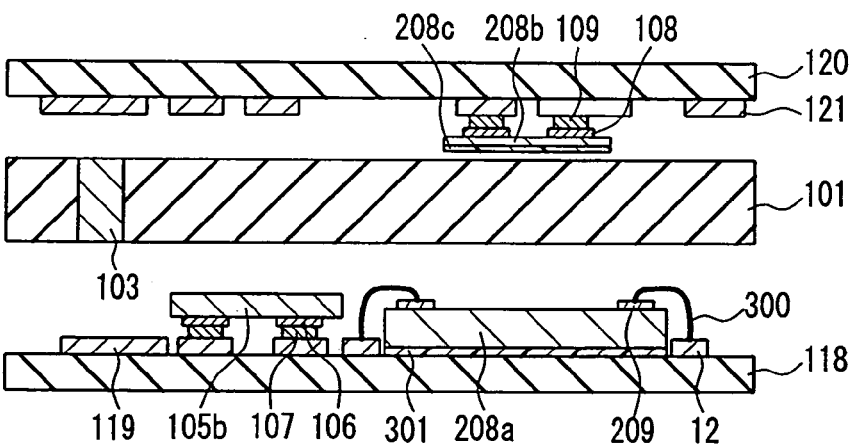
Figure 20E:
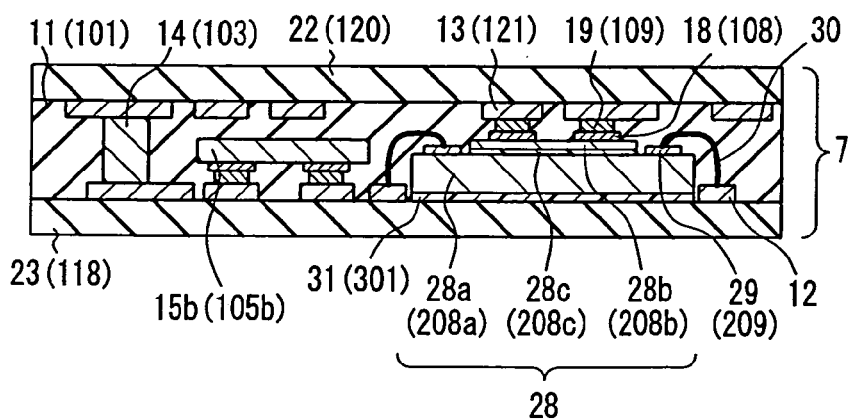

FIG. 19A is a cross section showing another embodiment of a electronic component-mounted structure of the present invention. Apart from differences in the structure of the mounted semiconductor chips and the mounting method thereof, a circuit board 7 with built-in electronic components of this embodiment is the same as the circuit board 6 with built-in electronic components of the sixth embodiment. A semiconductor chip 28 mounted in this embodiment is formed by attaching two semiconductor chips 28a and 28b with an adhesive 28c. However, unlike in the case of the sixth embodiment, a surface on which the external connection terminal 29 of the semiconductor chip 28a is provided and a surface on which the external connection terminal 18 of the semiconductor chip 28b is not provided are attached with the adhesive 28c, and the external connection terminal 29 of the semiconductor chip 28a is electrically connected to the first wiring pattern 12 with a wiring 30. The semiconductor chip 28a is attached to the circuit board 23 with an adhesive 31. Furthermore, the two semiconductor chips to be attached may both be mounted with wire bonding and, as shown in FIG. 19B for example, the external connection terminals 29a and 29b of the semiconductor chips 28a and 28b may also be electrically connected respectively to the first wiring pattern 12 and the second wiring pattern 13 using wirings 30a and 30b. In this case, the two semiconductor chips 28a and 28b are attached using the adhesive 28c, but it is preferable that a spacer 28d is provided between these so that their respective wirings 30a and 30b do not come into contact. Furthermore, the semiconductor chips 28a and 28b are respectively attached to the circuit boards 23 and 22 using the adhesives 31a and 31b, which is the same as in FIG. 19A.

FIGS. 20A to 20E are cross-sectional views showing the steps in an example method for manufacturing the circuit board 7 with built-in electronic components shown in FIG. 19A. It should be noted that an example of a method for manufacturing the circuit board 7 with built-in electronic components shown in FIG. 19A is described here, but it is also possible to manufacture the structure of the circuit board with built-in electronic components shown in FIG. 19B using the same method.

The steps (see FIGS. 20A to 20C) in which the sheet-form material 101 filled with the electroconductive resin composition 103 is manufactured are the same as in the first embodiment.

Following this, an electronic component-mounted structure on which semiconductor chips 208a and 105b are mounted on the circuit board 118 is prepared. In this electronic component-mounted structure, the semiconductor chip 208a is attached to the circuit board 118 with an adhesive 301 in such a manner that the surface on which the external connection terminal 209 is not provided is opposed to the circuit board 118. The external connection terminal 209 is electrically connected with a wiring 300 to the first wiring pattern 119 formed on the circuit board 118. Furthermore, as in the case of the sixth embodiment, the semiconductor chip 105b is mounted on the circuit board 119. Moreover, another electronic component-mounted structure on which a semiconductor chip 208b is mounted on the second wiring pattern 121 formed on the circuit board 120 is also prepared. The external connection terminal 108 of the semiconductor chip 208b is connected to the second wiring pattern 121 via a connection member 109. An adhesive 208c is applied to the surface of the semiconductor chip 208b. The electronic component-mounted structure on which the semiconductor chips 208a and 105b are mounted, and the electronic component-mounted structure on which the semiconductor chip 208b is mounted are positioned and superposed on the top and bottom surfaces of the sheet-form material 101 shown in FIG. 20C (see FIG. 20D). At this time, a gap may be provided, if necessary, in the sheet-form material 101. In this case, the electronic component-mounted structures can be positioned such that the semiconductor chip 208a and the semiconductor chip 208b are opposed to each other.

Next, the layered structure in which the following are positioned and superposed: the sheet-form material 101; the two electronic component-mounted structures (on one of which the semiconductor chips 208a and 105b are mounted on the circuit board 118, and on one of which the semiconductor chip 208b is mounted on the circuit board 120); is pressed in the layered direction by a pressing device and further heated. In this manner, the semiconductor chips 208a and 105b, the first wiring pattern 119, the semiconductor chip 208b, and the second wiring pattern 121 are embedded in the sheet-form material 101 to form an integrated whole. At this time, the semiconductor chip 208a and the semiconductor chip 208b are attached using the adhesive 208c. The circuit boards 118 and 120 become adhered to the insulating layer 101 in a mechanically firm manner. Through this process, the circuit board 7 with built-in electronic components is completed (see FIG. 20E).

It should be noted that, in the example manufacturing method shown in FIGS. 20A to 20E, the semiconductor chips 208a and 208b are attached after the semiconductor chips 208a and 208b have been mounted respectively on the circuit boards 118 and 120, but an equivalent embodiment of the circuit board with built-in electronic components also can be manufactured using a configuration in which the semiconductor chips 208a and 208b are attached to each other in advance.

Eighth Embodiment

Figure 22:
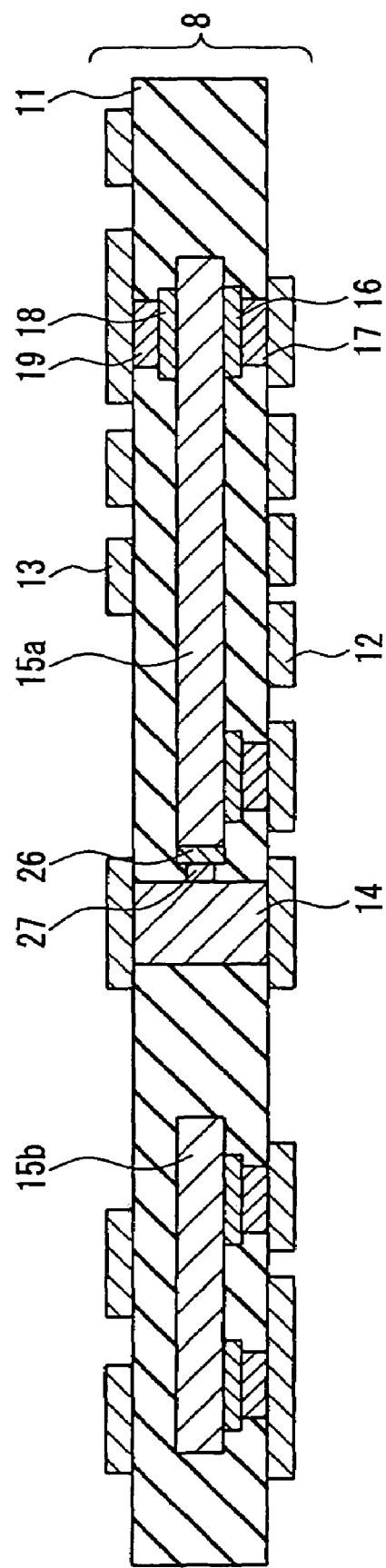
FIG. 22 is a cross-sectional view showing a configuration of a circuit board with built-in electronic components of an eighth embodiment of the present invention.
Figure 23:
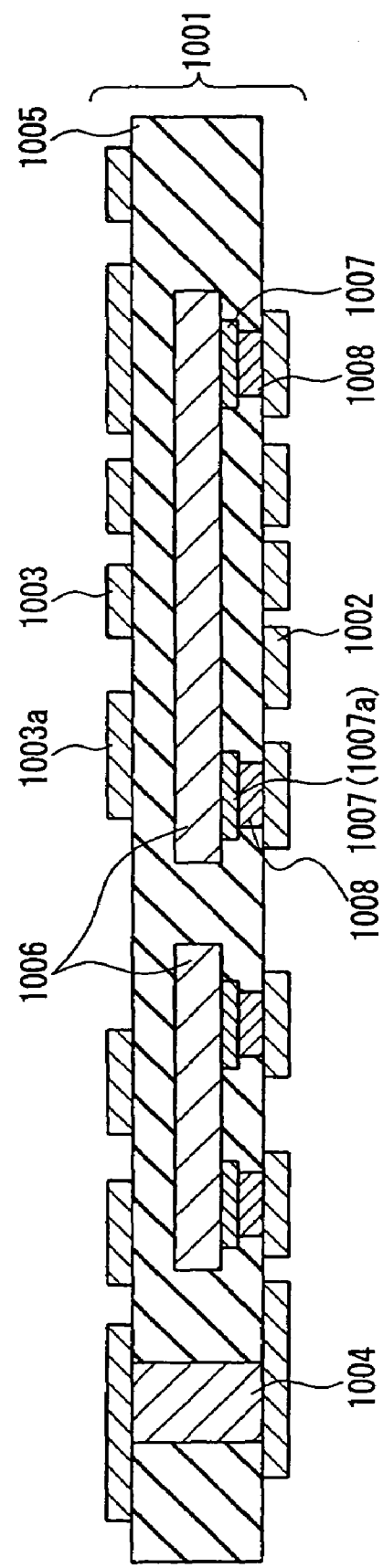
FIG. 23 is a cross-sectional view showing a configuration example of a conventional circuit board with built-in electronic components.
Figure 24:
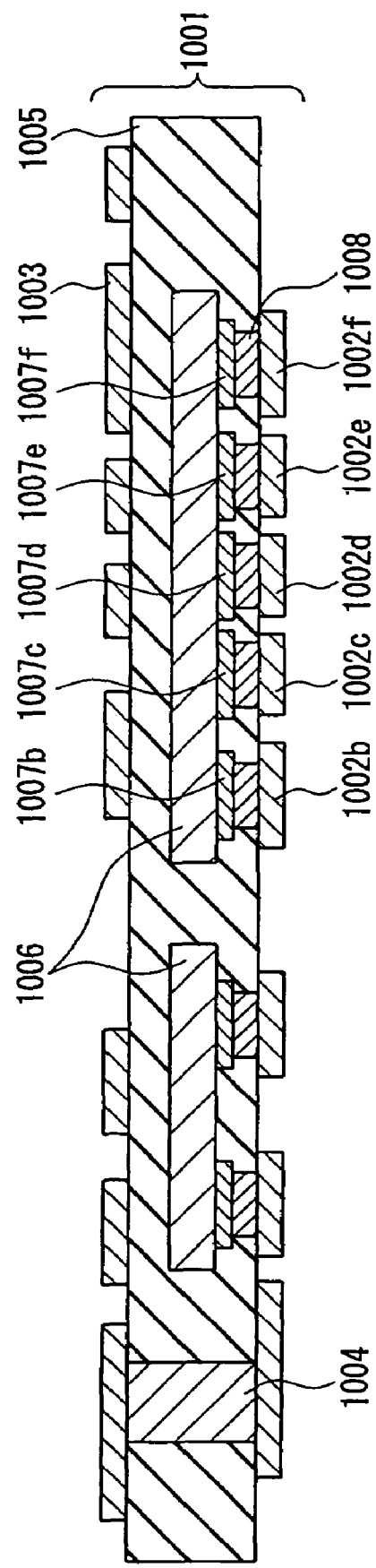
FIG. 24 is a cross-sectional view showing another configuration example of a conventional circuit board with built-in electronic components.

FIG. 22 is a cross section showing another embodiment of a circuit board with built-in electronic components of the present invention. In a circuit board 8 with built-in electronic components of this embodiment, the semiconductor chip 105a to be built in is further provided with an external connection terminal 26 on a side surface thereof, and the external connection terminal 26 is electrically connected to the inner via 14 via the connection member 27. With the circuit board 8 with built-in electronic components, in addition to the effect obtainable with the circuit board 1 with built-in electronic components of the first embodiment, the containment rate of wiring can be increased further and it is possible to achieve even further miniaturization of the semiconductor chip.

In the circuit boards 1 to 8 with built-in electronic components of the above-described embodiments 1 to 8, it is also possible to use a semiconductor chip that has a bare chip or an insulating film such as a polyimide as a rewired layer as the semiconductor chip to be built in.

It should be noted that the circuit boards 1 to 8 with built-in electronic components of the embodiments 1 to 8 are characterized in that electronic components in which external connection terminals are provided on different surfaces are built in, but when the electronic component to be built in is formed from a single surface such as a spherical body for example, the same effect can be obtained by providing the external connection terminals such that they face different orientations.

Furthermore, in the circuit boards 1 to 8 with built-in electronic components shown in the embodiments 1 to 8, since the external connection terminals provided on the semiconductor chips only have to function as electrodes, factors such as their shape are not limited in the case of embodiments 1 to 8.

In the circuit boards 1 to 8 with built-in electronic components shown in the embodiments 1 to 8, only the semiconductor chips are built in, but other chip-form electronic components that are passive components such as resistors, inductors, and capacitors may also be similarly built in.

It should be noted that it is possible to combine and implement as desired the configurations of the circuit boards 1 to 8 with built-in electronic components shown in the embodiments 1 to 8.

The circuit boards with built-in electronic components and the methods for manufacturing these as described above are useful in achieving greater density by increasing the containment rate of wiring in circuit boards with built-in electronic components in which electronic components are built in.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a circuit board with a built-in electronic component, comprising:
   (a) forming an electronic component by attaching at least two semiconductor chips with an adhesive;
   (b) positioning and mounting, on a sheet-form first electroconductive body, the electronic component including a first external connection terminal formed on a first surface and a second external connection terminal formed on a second surface different from the first surface so as to form an electronic component-mounted structure in which the first external connection terminal and the first electroconductive body are electrically connected;
   (c) forming a layered structure by positioning and superposing an uncured sheet-form material formed of a mixture including an inorganic filler and a thermosetting resin, and a sheet-form second electroconductive body in this order on the electronic component-mounted structure;
   (d) pressing the layered structure in a layered direction and heating the same to embed the electronic component of the electronic component-mounted structure in the sheet-form material, and to connect electrically the second external connection terminal and the second electroconductive body; and
   (e) forming wiring patterns using the first electroconductive body and the second electroconductive body respectively.

2. The method for manufacturing a circuit board with an built-in electronic component according to claim 1, wherein in the step of (b), a connection member is provided on the second external connection terminal of the electronic component.

3. The method for manufacturing a circuit board with an built-in electronic component according to claim 2, wherein the mixture contains an inorganic filler in an amount of 70 wt % or more and 95 wt % or less.

4. The method for manufacturing a circuit board with an built-in electronic component according to claim 1, wherein in the step of (c), a connection member is formed in a predetermined area on the second electroconductive body, and the second electroconductive body is superposed on the sheet-form material with the connection member in a direction facing the sheet-form material.

5. The method for manufacturing a circuit board with an built-in electronic component according to claim 4, wherein the connection member is formed with at least one selected from a solder, an electroconductive resin composition, an anisotropic conductive sheet and a projection electrode.

6. The method for manufacturing a circuit board with an built-in electronic component according to claim 5, wherein the connection member is formed by layering the projection electrode, and the anisotropic conductive sheet or the electroconductive resin composition.

7. The method for manufacturing a circuit board with an built-in electronic component according to claim 1, wherein the mixture contains an inorganic filler in an amount of 70 wt % or more and 95 wt % or less.

8. A method for manufacturing a circuit board with a built-in electronic component, comprising:
   (a) forming an electronic component by attaching at least two semiconductor chips with an adhesive;
   (b) positioning and mounting, on a first wiring pattern formed on a support member, the electronic component including a first external connection terminal formed on a first surface and a second external connection terminal formed on a second surface different from the first surface so as to form an electronic component-mounted structure in which the first external connection terminal and the first wiring pattern are electrically connected;
   (c) forming a layered structure by positioning and superposing an uncured sheet-form material formed of a mixture including an inorganic filler and a thermosetting resin, and a second wiring pattern formed on a support member in this order on the electronic component-mounted structure; and
   (d) pressing the layered structure in a layered direction and heating the same to embed the electronic component of the electronic component-mounted structure in the sheet-form material, and to connect electrically the second external connection terminal and the second wiring pattern.

9. The method for manufacturing a circuit board with an built-in electronic component according to claim 8, further comprising peeling the support member only from the layered structure after the step of (d).

10. The method for manufacturing a circuit board with an built-in electronic component according to claim 8, wherein in the step of (b), a connection member is provided on the second external connection terminal of the electronic component.

11. The method for manufacturing a circuit board with an built-in electronic component according to claim 10, wherein the connection member is formed with at least one selected from a solder, an electroconductive resin composition, an anisotropic conductive sheet, and a projection electrode.

12. The method for manufacturing a circuit board with an built-in electronic component according to claim 11, wherein the connection member is formed by layering the projection electrode, and the anisotropic conductive sheet or the electroconductive resin composition.

13. The method for manufacturing a circuit board with an built-in electronic component according to claim 8, wherein in the step of (c), a connection member is formed in a predetermined area of the second wiring pattern, and the second wiring pattern formed on the support member is superposed on the sheet-form material with the connection member in a direction facing the sheet-form material.

14. The method for manufacturing a circuit board with an built-in electronic component according to claim 13, wherein the connection member is formed with at least one selected from a solder, an electroconductive resin composition, an anisotropic conductive sheet, and a projection electrode.

15. The method for manufacturing a circuit board with an built-in electronic component according to claim 14, wherein the connection member is formed by layering the projection electrode, and the anisotropic conductive sheet or the electroconductive resin composition.

* * * * *